United States Patent
Park et al.

(10) Patent No.: US 9,543,489 B2
(45) Date of Patent: Jan. 10, 2017

(54) LIGHT EMITTING DEVICE

(71) Applicant: LG INNOTEK CO., LTD., Seoul (KR)

(72) Inventors: Ki Hoon Park, Seoul (KR); Jeong Hwan Park, Seoul (KR); Hyun Seok Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/890,095

(22) PCT Filed: Apr. 29, 2014

(86) PCT No.: PCT/KR2014/003781
§ 371 (c)(1),
(2) Date: Nov. 9, 2015

(87) PCT Pub. No.: WO2014/181996
PCT Pub. Date: Nov. 13, 2014

(65) Prior Publication Data
US 2016/0087178 A1 Mar. 24, 2016

(30) Foreign Application Priority Data
May 8, 2013 (KR) .................. 10-2013-0051766

(51) Int. Cl.
*H01L 33/62* (2010.01)
*H01L 25/075* (2006.01)
(Continued)

(52) U.S. Cl.
CPC ........... *H01L 33/62* (2013.01); *H01L 25/0753* (2013.01); *H01L 33/46* (2013.01); *H01L 33/64* (2013.01);
(Continued)

(58) Field of Classification Search
CPC ...... H01L 33/62; H01L 33/46; H01L 25/0753; H01L 33/64; H01L 2224/48091; H01L 2224/48137; H01L 2224/48227
See application file for complete search history.

(56) References Cited

U.S. PATENT DOCUMENTS

2010/0320483 A1   12/2010   Kadotani et al.
2011/0303927 A1   12/2011   Sanpei et al.
(Continued)

FOREIGN PATENT DOCUMENTS

JP    2010-205777 A    9/2010
JP    2010-287657 A    12/2010
(Continued)

OTHER PUBLICATIONS

International Search Report dated Aug. 19, 2014 issued in Application No. PCT/KR2014/003781.
(Continued)

*Primary Examiner* — Roy Potter
*Assistant Examiner* — Paul Patton
(74) *Attorney, Agent, or Firm* — Ked & Associates, LLP

(57) ABSTRACT

Disclosed is a light emitting device. The light emitting device includes a body, first and second metal layers on a top surface of the body, a heat radiation plate disposed between the first and second metal layers and having a circular outline, a plurality of light emitting parts on the heat radiation plate, first and second bonding regions disposed on the first and second metal layers and electrically connected with the light emitting parts, and a molding member disposed on the heat radiation plate to cover the light emitting parts. Each of the light emitting parts includes a plurality of light emitting chips connected with each other, and a plurality of wires to electrically connect the light emitting chips with the first and second bonding regions, and the wires of each light emitting part are arranged a radial direction about a central of the heat radiation plate.

20 Claims, 10 Drawing Sheets

(51) Int. Cl.
*H01L 33/64* (2010.01)
*H01L 33/46* (2010.01)

(52) U.S. Cl.
CPC ............... *H01L 2224/48091* (2013.01); *H01L 2224/48137* (2013.01); *H01L 2224/48227* (2013.01); *H01L 2924/181* (2013.01)

(56) References Cited

U.S. PATENT DOCUMENTS

| | | | |
|---|---|---|---|
| 2012/0205689 A1* | 8/2012 | Welch | H01L 25/0753 257/91 |
| 2014/0084311 A1* | 3/2014 | Takeda | H01L 25/0753 257/88 |
| 2014/0197431 A1 | 7/2014 | Oka | |

FOREIGN PATENT DOCUMENTS

| | | |
|---|---|---|
| JP | 2011-009298 A | 1/2011 |
| KR | 10-2009-0072644 A | 7/2009 |
| KR | 10-2010-0138781 A | 12/2010 |
| KR | 10-2012-0123601 A | 11/2012 |
| KR | 10-2013-0100719 A | 9/2013 |
| WO | WO 2013/015058 | 1/2013 |

OTHER PUBLICATIONS

European Search Report dated Nov. 3, 2016 issued in Application No. 14795411.9.

\* cited by examiner

LIGHT EMITTING DEVICE

CROSS-REFERENCE TO RELATED PATENT APPLICATIONS

This application is a U.S. National Stage Application under 35 U.S.C. §371 of PCT Application No. PCT/KR2014/003781, filed Apr. 29, 2014, which claims priority to Korean Patent Application No. 10-2013-0051766, filed May 8, 2013, whose entire disclosures are hereby incorporated by reference.

TECHNICAL FIELD

The embodiment relates to a light emitting device.

BACKGROUND ART

A light emitting device, for example, a light emitting diode (LED), which is a kind of a semiconductor device to convert electrical energy into light, has been spotlighted as a next-generation light source in substitution for a conventional fluorescent lamp and a glow lamp.

Since the LED generates the light by using the semiconductor device, the LED may represent significantly low power consumption as compared with the glow lamp that generates the light by heating tungsten or the fluorescent lamp that generates the light by urging ultraviolet ray, which is generated through the high-voltage discharge, to collide with a fluorescent substance.

In addition, since the LED generates the light by using the potential gap of the semiconductor device, the LED represents a longer life span, a rapider response characteristic, and a more eco-friendly feature as compared with those of a convention light source.

In this regard, various studies have been performed to substitute the conventional light source with the LEDs. The LEDs are increasingly used as light sources for lighting devices, such as various lamps used indoors and outdoors, liquid crystal displays, electric signboards, and street lamps.

DISCLOSURE

Technical Problem

The embodiment disposed a light emitting device having a plurality of wires that are a radial direction arranged.

The embodiment provides a light emitting device having a plurality of wires connected with mutually different light emitting chips and a radial direction arranged.

The embodiment provides a light emitting device having a plurality of wires protruding through mutually different regions of a spherical surface of a molding member and a radial direction arranged.

The embodiment provides a light emitting device having a plurality of wires passing an outline of a heat radiation plate including a plurality of light emitting chips and a radial direction arranged.

The embodiment provides a light emitting device in which wires passing an outline of a heat radiation plate in a circular shape are arranged in a perpendicular direction with respect to a tangential line passing one point of the outline of the heat radiation plate.

The embodiment provides a light emitting device in which a straight line to connect both ends of a wire connected with a light emitting chip disposed on a metal layer and a heat radiation plate is arranged to a radial direction about the center of the heat radiation plate.

The embodiment can provide a light emitting device having a plurality of wires connected with a molding member and a reflective member and arranged to a radial direction about the center of a heat radiation plate.

The embodiment can improve the heat radiation efficiency of a light emitting device having a plurality of light emitting chips.

The embodiment can improve the electrical reliability of a light emitting device having a plurality of light emitting chips.

Technical Solution

According to the embodiment, there is disposed a light emitting device including a body, first and second metal layers on a top surface of the body, a heat radiation plate disposed between the first and second metal layers and having a circular outline, a plurality of light emitting parts on the heat radiation plate, first and second bonding regions disposed on the first and second metal layers and electrically connected with the light emitting parts, and a molding member disposed on the heat radiation plate to cover the light emitting parts. Each of the light emitting parts includes a plurality of light emitting chips connected with each other, and a plurality of wires to electrically connect the light emitting chips with the first and second bonding regions, and the wires of each light emitting part are arranged to a radial direction about a center of the heat radiation plate.

Advantageous Effects

The embodiment can improve the reliability of the light emitting device having a plurality of light emitting chips.

The embodiment can reduce the heat radiation efficiency of the light emitting device having the light emitting chips.

The embodiment can improve the light emitting device and the reliability of the lighting system having the light emitting device.

BEST MODE

Mode for Invention

Figure 1:
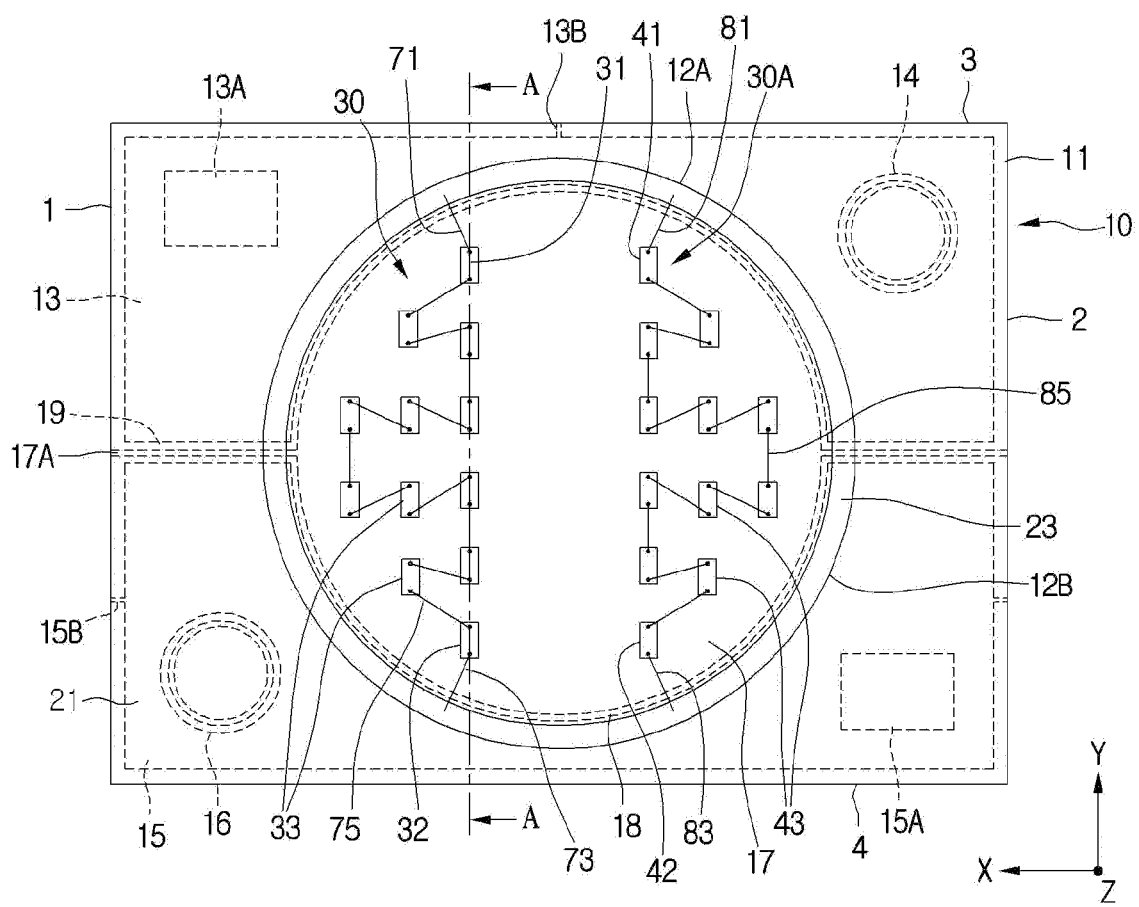
FIG. 1 is a plan view showing a light emitting device according to the first embodiment.

Hereinafter, embodiments will be described in detail with reference to accompanying drawings so that those skilled in the art can easily replicate with the embodiments. However, the embodiments may not be limited to those described below, but have various modifications.

In the following description, when a predetermined part "includes" a predetermined component, the predetermined part does not exclude other components, but may further include other components unless otherwise indicated. In the description of the embodiments, it will be understood that, when a layer, a film, or a plate is referred to as being "on" or "under" another layer, another film, another region, or another plate, it can be "directly" or "indirectly" on the other layer, film, region, plate, or one or more intervening layers may also be present. On the contrary, when one part is "directly" on another part, there is not intervening layer therebetween.

The thickness and size of each layer shown in the drawings may be exaggerated, omitted or schematically drawn for the purpose of convenience or clarity. In addition, the size of elements does not utterly reflect an actual size. Like reference numbers will be assigned like elements throughout the drawings.

Hereinafter, a light emitting device according to the first according to the embodiment of the disclosure will be described with reference to FIGS. 1 to 5.

Figure 2:
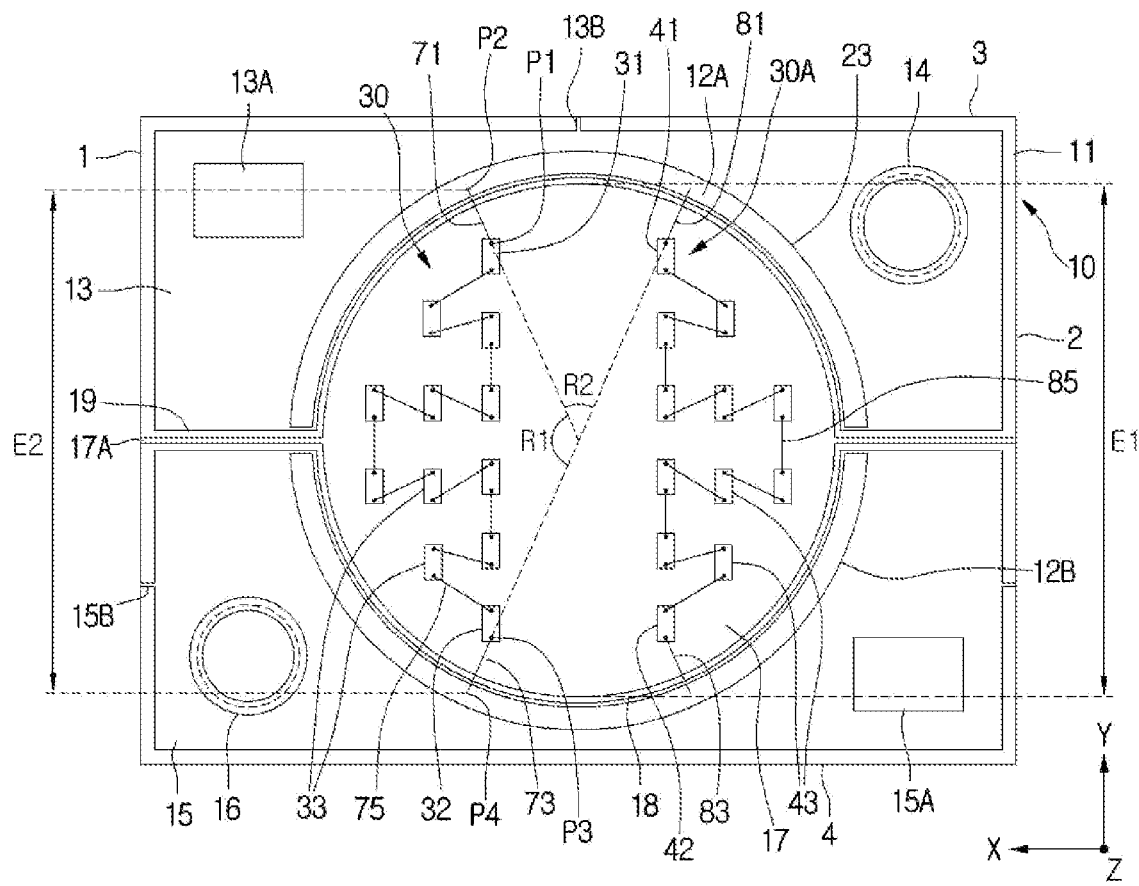
FIG. 2 is a plan view showing a heat radiation plate, and first and second metal layers in the light emitting device of FIG. 1 in detail.
Figure 3:
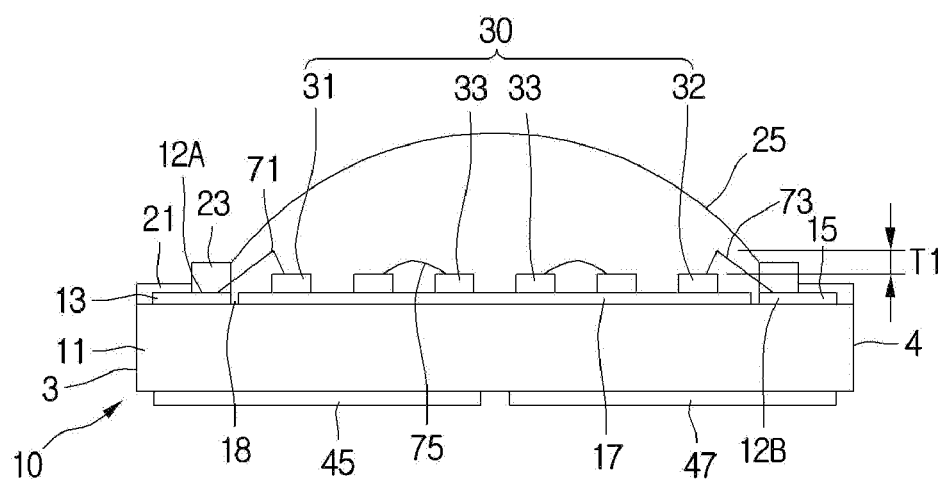
FIG. 3 is a sectional view taken along line A-A of the light emitting device of FIG. 1.
Figure 4:
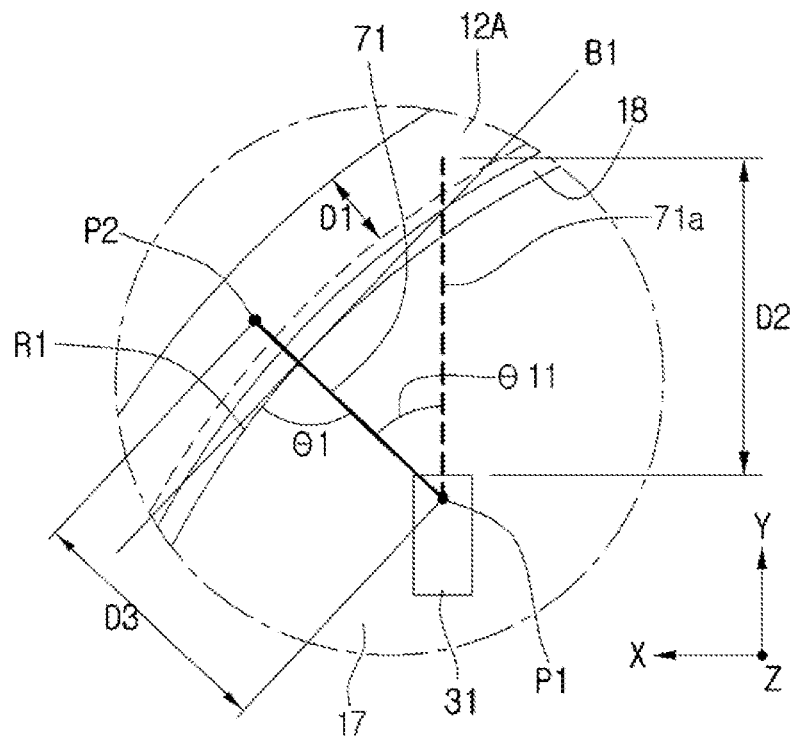
FIG. 4 is a view showing the connection state of the first wire of the first light emitting part in the light emitting device of FIG. 1.
Figure 5:
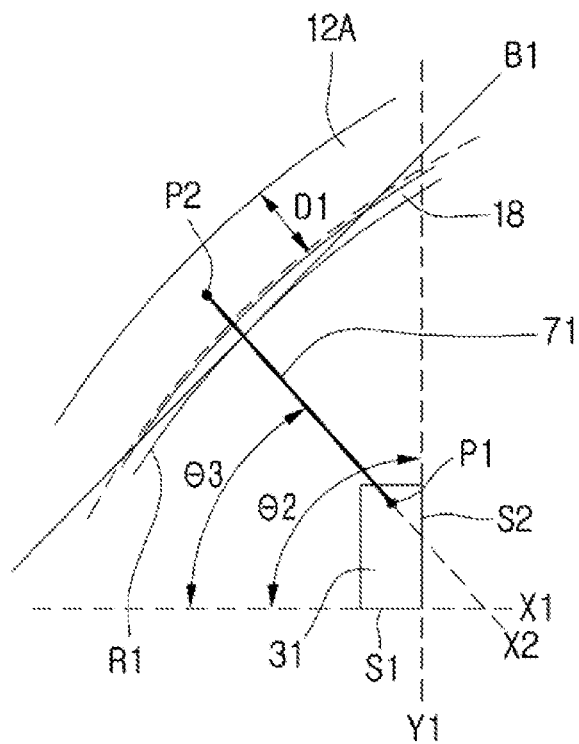
FIG. 5 is a graph showing the connection state of a first wire of a first light emitting part in the light emitting device of FIG. 1.

FIG. 1 is a plan view showing a light emitting device according to the first embodiment, FIG. 2 is a plan view showing a heat radiation plate, and first and second metal layers in the light emitting device of FIG. 1, FIG. 3 is a sectional view taken along line A-A of the light emitting device of FIG. 1, FIG. 4 is a view showing the connection state of the first wire of the first light emitting part in the light emitting device of FIG. 1, and FIG. 5 is a graph showing the connection state of a first wire of a first light emitting part in the light emitting device of FIG. 1.

Referring to FIGS. 1 to 5, the light emitting device includes a body 11, a plurality of metal layers 13 and 15 disposed on a top surface of the body 11; a heat radiation plate 17 disposed between the metal layers 13 and 15; a plurality of light emitting parts 30 and 30A having light emitting chips 31, 32, 33, 41, 42, and 43 on the heat radiation plate 17; a reflective member 23 disposed around the heat radiation plate 17; a molding member 25 on the heat radiation plate 17; and a plurality of wires 71, 73, 81, and 83 to connect the light emitting parts 30 and 30A with the metal layers 13 and 15. The light emitting device may include a plurality of metal layers 45 and 47 on a bottom surface of the body 11 and a plurality of connection electrodes 14 and 16 and a plurality of connection electrodes 14 and 16 disposed in the body 11.

The light emitting device, which is a package or unit having the light emitting chips 31, 32, 33, 41, 42, and 43, may be applied to a lighting device such as a light, an indoor light, an outdoor light, an indicator, and a headlight.

The body 11 of the light emitting device may include an insulating material, for example a resin material such as silicon, epoxy, or plastic. For example, the body 11 may include a resin material such as polyphthalamide (PPA). The silicon includes a white-based resin. The body 11 may selectively include acid anhydride, an antioxidant, a release agent, an optical reflector, an inorganic filling agent, a curing catalyst, a light stabilizer, a lubricant, or a titanium dioxide. The body 11 may be molded by using at least one selected from the group consisting of epoxy resin, modified epoxy resin, modified silicon resin, acrylic resin, and urethane resin. For example, the body 11 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU(1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

According to another example, the body 11 includes an insulating material, for example a ceramic material. The ceramic material includes low temperature co-fired ceramic (LTCC), or high temperature co-fired ceramic (HTCC). The body 11 may include metallic oxide, such as $SiO_2$, $Si_xO_y$, $Si_3N_4$, $Si_xN_y$, $SiO_xN_y$, or $Al_2O_3$.

The body 11 includes first and second lateral sides 1 and 2 opposite to each other and third and fourth lateral sides 3 and 4 adjacent to the first and second lateral sides 1 and 2 and opposite to each other. The first and second lateral sides 1 and 2 may have lengths equal to or greater than those of the third and fourth lateral sides 3 and 4. Although the top-view shape of the body 11 is a polygonal shape, for example a rectangular shape, the body 11 may have a curved shape.

As shown in FIGS. 1 and 3, the body 11 is disposed on the top surface thereof with the metal layers 13 and 15, for example, separated from each other. The first metal layer 13 may be disposed at a first region of the top surface of the body 11, and may be disposed adjacent to the first, second, and third lateral sides 1, 2, and 3 of the body 11. The second metal layer 15 may be disposed in a second region of the top surface of the body 11 and disposed adjacent to the first, second, and fourth lateral sides, 1, 2, and 4 of the body 11.

The body 11, and the first and second metal layers 13 and 15 may be included in the circuit board 10. The body 11 is disposed on a bottom surface thereof with a plurality of metal layers, such as third and fourth metal layers 45 and 47. The circuit board 10 may further include the third and fourth metal layers 45 and 47. The third metal layer 45 may be overlapped with the first metal layer 13 perpendicularly to the first metal layer 13. The third metal layer 45 may be overlapped with the heat radiation plate 17 perpendicularly to the heat radiation plate 17. The third metal layer 45 may have a region wider than that of the first metal layer 13. The fourth metal layer 47 may be overlapped with the second metal layer 15 perpendicularly to the second metal layer 15. The fourth metal layer 47 may be overlapped with the heat radiation plate 17 perpendicularly to the heat radiation plate 17. The fourth metal layer 47 may have a region wider than a region of the second metal layer 15. The heat radiation efficiency of the light emitting device may be improved by the third and fourth metal layers 45 and 47. The third and fourth metal layers 45 and 47 may be mounted on a board having a circuit pattern, but the embodiment is not limited thereto.

The body 11 includes the first and second connection electrodes 14 and 15, for example, separated from each other. The circuit board 10 may include the first connection electrode 14 and the second connection electrode 16. The first connection electrode 14 may be overlapped with regions of the first and third metal layers 13 and 45 perpendicularly to the regions of the first and third metal layers 13 and 45. The first connection electrode 14 is electrically connected with the first and third metal layers 13 and 45. One first connection electrode 14 or a plurality of first connection electrodes 14 may be disposed in the body 11, but the embodiment is not limited thereto.

The second connection electrode 16 may be overlapped with regions of the second and fourth metal layers 15 and 47 perpendicularly to the regions of the second and fourth metal layers 15 and 47. The second connection electrode 16 is electrically connected with the second and fourth metal layers 15 and 47. One second connection electrode 16 or a plurality of second connection electrodes 16 may be disposed in the body 11, but the embodiment is not limited thereto.

The interval between the first and second connection electrodes 14 and 16 may be wider than the width of the heat radiation plate 17. Accordingly, the power path of the light emitting device may be distributed, and the heat radiation efficiency can be improved.

The heat radiation plate 17 is disposed on the top surface of the body 11. The heat radiation plate 17 may be disposed between the first and second metal layers 13 and 15, and may be overlapped with the third and fourth metal layers 45 and 47 perpendicularly to the third and fourth metal layers 45 and 47, respectively. The first and second metal layers 13 and 15 may be disposed at outer lateral sides of the heat radiation plate 17 so that the first and second metal layers 13 and 15 face each other. The first metal layer 13 covers 45% to 49% of the outer lateral side of the heat radiation plate 17, and the second metal layer 15 covers 45% to 49% of the outer lateral side of the heat radiation plate 17. The first and second metal layers 13 and 15 are disposed along an outline of the heat radiation plate 17.

An inner region of the first metal layer 13 corresponding to the outer lateral side of the heat radiation plate 17 may be formed in a semi-circular shape. An inner region of the second metal layer 15 corresponding to the outer lateral side of the heat radiation plate 17 may be formed in a semi-circular shape.

When viewed from the top view, the heat radiation plate 17 has a shape with a curved surface. For example, the heat radiation plate 17 may have a circular shape. The outline of the heat radiation plate may have a circular shape. The diameter E1 of the heat radiation plate may be 50% or more of the width of the body 11, in detail, 70% or more of the width of the body 11. The diameter E1 of the heat radiation plate may be formed in the range of 79% to 95% of the width of the body 11. The width of the body 11 may be an X axial length, and the length of the body 11 may be a Y axial length. In this case, the width of the body 11 may be the interval between the first and second lateral sides 1 and 2, but the embodiment is not limited thereto.

The heat radiation plate 17 may be formed with a thickness equal to or thicker than those of the first and second metal layers 13 and 15.

The protective layer 21 may be disposed on the top surface of the first and second metal layer 13 and 15. The protective layer 21 may be disposed at a boundary region between the first and second metal layers 13 and 15 and at an outer lateral side of the first and second metal layers 13 and 15. The protective layer 21 may be formed on edges of the first, second, and fourth lateral sides 1, 2, and 4 of the body 11. Accordingly, the first metal layer 13 are spaced apart from the edges of the first, second, and third lateral sides 1, 2, and 3 of the body 11, and the second metal layer 15 is spaced apart from the edge of the first, second, and fourth lateral sides 1, 2, and 4 of the body 11. The protective layer 21 prevents the surfaces of the first and second metal layers 13 and 15 from being exposed. The protective layer 21 may prevent the first and second metal layers 13 and 15 from corroded or degraded in electrical reliability. For example, the protective layer 21 may be formed of an insulating material, for example, a material, such as a photoresist, but the embodiment is not limited thereto.

The first metal layer 13 includes a first open region 13A, a first support protrusion 13B, and a first bonding region 12A. The first open region 13A may be a region of the top surface of the second metal layer 15 having no the protective layer 21, and a wire may make contact with or bonded to the region. The first support protrusion 13B extends from the first metal layer 13 to at least one lateral side of the body 11, for example, the third lateral side 3. The first support protrusion 13B may be a drawing terminal for plating, or may support the first metal layer 13 in injection. The first bonding region 12A is disposed along the circumference of the heat radiation plate 17. The first bonding region 12A is a region recessed in a hemi-spherical shape along an outer contour of the heat radiation plate 17. The first bonding region 12A is an open region having no protective layer 21, and connected with the light emitting parts 30 and 30A to supply power having first polarity.

The second metal layer 15 includes a second open region 13A, a second support protrusion 13B, and a second bonding region 12B. The second open region 13A may be a region of the top surface of the second metal layer 15 having no the protective layer 21, and a separate wire may make contact with or bonded to the second open region 13A. At least one second support protrusion 15B is disposed and extends from the second metal layer 15 to at least one lateral side of the body 11. The second support protrusion 15B may be a drawing terminal for plating, or may support the second metal layer 13 in injection. For example, when a plurality of second support protrusions 15B are disposed, the second support protrusions 15B may extend toward the first and second lateral sides 1 and 2 of the body 11. The second bonding region 12B is disposed along the circumference of the heat radiation plate 17. For example, the second bonding region 12B is a region recessed in a hemi-spherical region along the outer contour of the heat radiation plate 17. The second bonding region 12B is an open region having no protective layer 21, and connected with the light emitting parts 30 and 30A to supply power having second polarity.

Since the first and second bonding regions 12A and 12B are disposed along an outer circumference of the heat radiation plate, the lengths and the positions of the wires 71, 73, 81, and 83, and the light emitting chips 31, 32, 33, 41, 42, and 43 may be easily arranged.

The first to fourth metal layers 13, 15, 45, and 47 may include metal including at least one of titanium (Ti), copper (Cu), nickel (Ni), gold (Au), chromium (Cr), tantalum (Ta), platinum (Pt), tin (Sn), silver (Ag), phosphorus (P) aluminum (Al), and palladium (Pd). The first to fourth metal layers 13, 15, 45, and 47 may be formed at multiple layers including mutually different metals. A plating layer may be formed on the surface of the first to fourth metal layers 13, 15, 45, and 47, but the embodiment is not limited thereto. The plating layer may be exposed onto the first and second bonding regions 12A and 12B.

The first gap part 18 is disposed along the circumference of the heat radiation plate, and disposed between the first and second metal layers 13 and 15 and the heat radiation plate 17. The first gap part 18 may have a ring shape. The first gap part 18 prevents the heat radiation plate 17 from contacting the first and second metal layers 13 and 15. A portion of the molding member 25 may be disposed in the first gap part 18, or a portion of the reflective member 23 may be disposed in the first gap part 18.

The second gap part 19 is disposed between the first and second metal layers 13 and 15, and connected with the first gap part 18. The second gap part 19 may serve as a space between the first and second metal layers 13 and 15 at a region excluding the heat radiation plate 17. The second gap part 19 may have a width wider than that of the first gap part 18. Accordingly, the interval between the first and second metal layers 13 and 15 may be wider than the gap between the heat radiation plate 17 and the first metal layer 13 or the second metal layer 15.

The heat radiation plate 17 may include a third support protrusion 17A, and the third support protrusion 17A may extend to the lateral side of the body 11, for example the first and second lateral sides 1 and 2 along the second gap part 19. The third support protrusion 17A may extend apart from the heat radiation plate 17, but the embodiment is not limited thereto. The third support protrusion 17A may be spaced apart from the first and second metal layers 13 and 15 in the second gap part 19.

As shown in FIGS. 1 and 3, the reflective member 23 is disposed around the circumference of the heat radiation plate 17. The reflective member 23 may have a ring shape. The inner diameter of the ring may be equal to or smaller than the diameter of the heat radiation plate 17. The reflective member 23 corresponds to an outer lateral side of the molding member 25. The reflective member 23 may make contact with the outer lateral sides of the molding member 25. The reflective member 23 may be disposed between the protective layer 21 and the molding member 25. The reflective member 23 may make contact with the first and second metal layers 13 and 15 and the protective layer 21. Since the reflective member 23 reflects light emitted through the molding member 25, the light extraction efficiency and the light intensity of the light emitting device can be improved.

The reflective member 23 may have the thickness equal to or thicker than the thickness of the protective layer 21. Accordingly, the light loss may be reduced by the reflective member 23. The reflective member 23 may be disposed on the first and second bonding regions 12A and 12B. For example, the reflective member 23 may make contact with the first and second bonding regions 12A and 12B. The reflective member 23 may be disposed in the first gap part 18.

The reflective member 23 may include a resin material, such as silicon or epoxy, and a metallic oxide may be added to the inner part of the reflective member 23. The reflective member 23 may be formed of an insulating material. In the reflective member 23, the metallic oxide includes a material, such as TIO2, Al2O3, or SiO2, having a refractive index higher than that of the molding member. In addition, 5 wt % or more of the metallic oxide may be added to the inner part of the reflective member 23. The reflective member 23 represents reflectance of 50% or more, in detail, 78% or more with respect to light emitted from the light emitting chips 31, 32, and 33. The height or the thickness of the reflective member 23 is 600±20 μm, and the width of the reflective member 23 may be formed in the range of 1000±100 μm. If the reflective member 23 is excessively low or high, the light reflection efficiency may be degraded. In addition, if the width of the reflective member 23 is significantly narrow, the reflective member 23 may not be formed. If the width of the reflective member 23 is significantly narrow, heat radiation efficiency may be lowered.

The light emitting parts 30 and 30A are disposed on the heat radiation plate 17. The light emitting part 30 and 30A may be electrically connected with the first and second metal layers 13 and 15 in parallel to each other. The light emitting parts 30 and 30A include a plurality of light emitting chips 31, 32, 33, 41, 42, and 43 coupled to each other and a plurality of wires 71, 73, 81, and 83 passing the outer lateral side of the molding member 25 to be selectively the first and second metal layers 13 and 15. The wires 71, 73, 81, and 83 may be connected with the first and second metal layers 13 and 15 after passing the molding member 23. The wires 71, 73, 81, and 83 may make contact with the reflective member 23 and the molding member 25. At least one of the light emitting parts 30 and 30A may not be arranged in parallel to straight lines passing through both terminals of the wires 71, 73, 81, and 83.

The light emitting parts 30 and 30A includes, for example the first and second light emitting parts 30 and 30A. In the first light emitting part 30, the light emitting chips 31, 32, and 33 are connected with each other in series. The second light emitting part 30A is spaced apart from the first light emitting part 30 and includes the light emitting chips 41, 42, and 43 connected with each other in series. Each of the first and second light emitting parts 30 and 30A may be defined as the array of light emitting chips, but the embodiment is not limited thereto. In addition, one of the first and second light emitting parts 30 and 30A may not be arranged, or may be arranged at the center of the light emitting part 17.

Each of the light emitting parts 30 and 30A may include at least five light emitting chips connected with each other in series. Each light emitting chip serves as a light source, and selectively emits light in a wavelength band ranging from ultraviolet ray to visible ray. The light emitting chips 31, 32, 33, 41, 42, and 43 includes one of an ultraviolet (UV) LED chip, a green LED chip, a blue LED chip, and a red LED chip. Phosphors may be applied to a light exit region of the light emitting chips 31, 32, 33, 41, 42, and 43, but the embodiment is not limited thereto.

The molding member is disposed on the heat radiation plate 17. The molding member 25 covers the light emitting parts 30 and 30A. The molding member 25 may include a transparent or transmissive material such as silicon or epoxy. According to another example, the molding member 25 may include at least one of rigid silicon resin, flexible silicon resin, and silicon rubber. The molding member 25 may have a semi-spherical sectional surface, but the embodiment is not limited thereto. The outer lateral side of the molding member 25 may be formed in a ring shape, and may make contact with the molding member 23. The molding member 25 covers the light emitting chips 31, 32, 33, 41, 42, and 43 disposed on the heat radiation plate 17. The molding member 25 covers the wires 71, 73, 75, 81, 83, and 85. The molding member 25 may be disposed in the first gap part 18.

The phosphor is formed in the molding member 25. The phosphor may include at least one of a yellow phosphor, a green phosphor, a blue phosphor and a red phosphor. For example, the phosphor may include at least one selected from the group consisting of a nitride based phosphor, an oxy-nitride based phosphor and a sialon based phosphor, which are mainly activated by lanthanoid based elements, such as Eu or Ce; Alkaline-earth halogen apatite phosphor, an alkali earth metal borate halogen phosphor, and an alkali earth metal aluminate phosphor, which are mainly activated by a lanthanoid based element, such as Eu, or a transient metallic element, such as Mn; an alkali earth metal boric acid halogen phosphor; an alkali earth metal aluminate phosphor; an alkali earth silicate; an alkali earth sulfide; an alkali earth thio-gallate; an alkali earth silicon nitride; a germinate; a rare-earth aluminate mainly activated by a lanthanoid based element, such as Ce; a rare-earth silicate; and an organic chelating agent mainly activated by a lanthanoid based element, such as Eu. In detail, the phosphor may be used, but the embodiment is not limited thereto. The molding member 25 may include a filler, but the embodiment is not limited thereto.

The outer contour of the molding member 25 may have a circular shape. The outer spherical surface of the molding member 25 may make contact with the reflective member 23. The molding member 25 and the reflective member 23 may be formed of mutually different silicon materials. Accordingly, the adhesive strength between the molding member 25 and the reflective member 23 may be enhanced. The reflective member 23 may serve as a bank to restrict the inflation of the molding member 25. In addition, the reflective member 23 may prevent the molding member 25 from being overflown. A protective chip (not shown) may be disposed on at least one of the heat radiation plate 17 and the first and second metal layers 13 and 15, but the embodiment is not limited thereto.

Meanwhile, the first light emitting part 30 includes the first light emitting chip 31 adjacent to the metal layer 13, the second light emitting chip 32 adjacent to the second metal layer 15, a plurality of third light emitting chips 33 connected with each other between the first and second light emitting chips 31 and 32, the first wire 71 connected with the first light emitting chip 31 and the first metal layer 13, and the second wire 73 connected between the second light emitting chip 32 and the second metal layer 15. The first light emitting part 30 may include the connection member 75 to connect the third light emitting chips 33 with each other, and the connection member 75 includes a wire.

As shown in FIG. 2, both terminals P1 and P2 of the first wire 71 are connected with the first light emitting chip 31 and the first metal layer 13. Both terminals P3 and P4 of the second wire 73 are connected with the second light emitting chip 32 and the second metal layer 15. The second terminal P2 of the first wire 71 is bonded to the first bonding region 12A of the first metal layer 13, and the second terminal P4 of the second wire 73 is bonded the second bonding region 12B of the second metal layer 15.

For example, at least three third light emitting chips 33 may be connected with each other in series. The third light emitting chips 33 may be arranged in one row, two rows, or three rows. The third light emitting chips 33 are connected with each other by the connection member 75. The first and second light emitting chips 31 and 32 are arranged at input and output sides of the first light emitting part 30. At least one of the third light emitting chips 33 may be arranged in parallel to or on a straight line passing the centers of the first and second light emitting chips 31 and 32 or may be arranged in line with each other.

The second light emitting part 30A includes the fourth light emitting chip 41 adjacent to the first metal layer 13, the fifth light emitting chip 42 adjacent to the second metal layer 15, a plurality of sixth light emitting chips connected with each other between the fourth light emitting chip 41 and the fifth light emitting chip 42, the third wire 81 connected between the fourth light emitting chip 41 and the first metal layer 13, and the fourth wire 83 connected between the fifth light emitting chip 42 and the second metal layer 15. The second light emitting part 30A may include the connection member 85 to connect the sixth light emitting chips 43 with each other, and the connection member 85 includes a wire.

Both terminals of the third wire 81 are connected with the fourth light emitting chip 41 and the first metal layer 13. Both terminals of the fourth wire 83 are connected with the fifth light emitting chip 42 and the second metal layer 15. The third wire 81 is bonded to the first bonding region 12A of the first metal layer 13, and the fourth wire 83 is bonded to the second bonding region 12B of the second ml 15. A plurality of sixth light emitting chips 43, for example three six light emitting chips may be connected with each other in series. The six light emitting chips 43 may be disposed in one row, two rows, or three or rows. In addition, the sixth light emitting chips 43 may be connected with each other by the connection member 85. The fourth and fifth light emitting chips 41 and 42 are arranged at the input and output sides of the second light emitting part 30A. At least one of the sixth light emitting chips 43 may be arranged in parallel to or be arranged on the straight line passing the centers of the fourth and fifth light emitting chips 41 and 42 or in line with each other.

Each of the first to fourth wires 71, 73, 81, and 83 makes contact with the molding member 25 and the reflective member 23. Each of the first to fourth wires 71, 73, 81, and 83 are connected with the inner parts of the molding member 25 and the reflective member 23. Each of the first to fourth wires 71, 73, 81, and 83 may protrude through the outer spherical surface of the molding member 25, and extend into the reflective member 23.

The interval E2 between the second terminal P2 of the first wire 71 and the fourth terminal P4 of the second wire 73 may be equal to or shorter than the diameter E1 of the heat radiation plate 17, but the embodiment is not limited thereto.

Meanwhile, as shown in FIG. 2, the first wire 71 may extend from the first light emitting chip 31 in the radial direction about the center from the heat radiation plate 17. The second wire 73 may extend from the second light emitting chip 32 in the radial direction about the center of the heat radiation plate 17. The third wire 81 may extend from the fourth light emitting chip 41 in the radial direction about the center of the heat radiation plate 17. The fourth wire 83 may extend from the sixth light emitting chip 43 in the radial direction about the center of the heat radiation plate 17. The first to fourth wires 71, 73, 81, and 83 may extend to the radial direction about the center of the heat radiation plate 17. The first to fourth wires 71, 73, 81, and 83 may extend to the radial direction about the center of the molding member 25.

The first straight line passing both ends P1 and P2 of the first wire 71 may extend to the radial direction about the center of the heat radiation plate 17 and the molding member 25. The second straight line passing both ends P3 and P4 of the second wire 73 may extend to the radial direction about the center of the heat radiation plate 17 or the molding member 25. The third straight line passing through the third wire 81 may extend to the radial direction about the center of the heat radiation plate 17 or the molding member 25. The fourth straight line passing both ends of the fourth wire 83 may extend to the radial direction about the center of the heat radiation plate 17 or the molding member 25.

An angle R1 between the first straight line to link both ends of the first wire 71 with each other and the second straight line to link both ends of the second wire 73 may be an obtuse angle. An angle between the third straight line to link both ends of the third wire 81 with each other and the fourth straight line to link both ends of the fourth wire 83 with each other may be an obtuse angle. An angle R2 between the first straight line and the third straight line may be an acute angle. The angle between the second straight line and the fourth line may be an acute angle.

As shown in FIG. 3, highest points of the first and second wires 71 and 73 may be located higher than the highest point of the connection member 75. The interval between the highest points of the first and second wires 71 and 73 and the top surfaces of the first and second light emitting chips 31 and 32 may be formed in the range of 180 μm to 200 μm. The highest points of the first and second wires 71 and 73 may be located higher than the highest point of the connection member by a value in the range of 30 μm to 50 μm. In addition, although not shown, the highest points of the third and fourth wires 81 and 83 may be located higher than the highest point of the connection member 85, for example by a value in the range of 30 μm to 50 μm.

The highest pointer of the first to fourth wires 71, 73, 81, and 83 are located higher than the highest points of the connection members 75 and 85, thereby reducing the impact transferred to the first to fourth wires 71, 73, 81, 83 as the molding member 25 is expanded or contacted. In addition, both ends of the first to fourth wires 71, 73, 81, and 83 are arranged in the same direction of the expansion direction and the contraction direction of the molding member 25, so that the impact transferred to the first and second wires 71 and 73 by the thermal deformation of the molding member 25. In other words, the first to fourth wires 71, 73, 81, and 83 are connected with each other through a radial bonding manner that can minimize the tensile force transferred from the molding member 25.

In detail, as shown in FIGS. 2 and 3, the first ends P1 and P3 of the first and second wires 71 and 73 are bonded to the first and second light emitting chips 31 and 32, and disposed in the molding member 25. The second end P2 of the first wire 71 is bonded to the first bonding region 12A of the first metal layer 13, and the second end P4 of the second wire 73 is bonded to the second bonding region 12B of the second metal layer 15. In this case, the second ends P2 and P4 of the first and second wires 71 and 73 are disposed in the reflective member 23. The first ends P1 and P3 of the first and second wires 71 and 73 are disposed in the molding member 25. The first and second wires 71 and 73 are disposed in the reflective member 23 and the molding member 25 so that the tensile force transferred to the first and second wires 71 and 73 due to the difference in thermal expansion between the mutually different resin members can be reduced.

Hereinafter, the first wire 71 among the first to fourth wires 71, 73, 81, and 83 according to the embodiment will be described with reference to FIGS. 4 and 5. The second to fourth wires 73, 81, and 83 can be understood by making reference to the following description of the first wire 71.

Referring to FIGS. 4 and 5, the first wire 71 extends in a direction that a first angle θ1 is formed with respect to a first tangential line B1 passing one point of the circular outline of the heat radiation plate 17. The first angle θ1 may be formed in the range of 85° to 95°. As the first angle θ1 approaches 95°, the impact caused by the molding member 25 transferred to the first wire 71 may be reduced. In other words, the first wire 71 may be formed such that the first straight line to link the first end P1 with the second end P2 forms a right angle or a substantially right angle with respect to the first tangential line B passing the contour or the outline of the heat radiation plate 17 having a circular shape. The first straight line may form the angle in the range of 85° to 95° with respect to the first tangential line B1. When the first wire 71 forms a right angle with respect to the first tangential line B1 or is a perpendicular line to the first tangential line B1, the impact transferred to the first wire 71 may be minimized.

In this case, the distance D3 between the first and second ends P1 and P2 of the first wire 71 may be shorter than the distance D2 between two ends of a wire 71a extending in another direction according to the comparative example. The straight line passing the two ends P1 and P2 of the first wire 71 may be titled at 5° or more from the straight line passing both ends of the wire 71a according to the comparative example. In this case, the straight line passing both ends of the wire 71a according to the comparative example may be defined as a straight line passing the center of the first and second light emitting chips 31 and 32.

In addition, the width D1 of the first bonding region 12A or the second bonding region 12B may be formed in the range of 280 μm to 320 μm. The width D1 may be formed as the width to ensure the space of the second end P2 of the first wire 71.

As shown in FIG. 1, similarly to the first wire 71, each of the second and fourth wires 73, 81, and 83 may be placed at a right angle or a substantially right angle, for example, an angle in the range of 85° to 95° with respect to the second tangential line passing a predetermined one point of the outline of the heat radiation plate 17. When the straight line passing both ends of the second to fourth wires 73, 81, and 83 is a perpendicular line or forms a right angle with respect to the second tangential line, the external impact transferred to the second to fourth wires 73, 81, and 83 may be minimized. The details of the second to fourth wires 73, 81, and 83 can be understood by making reference to the description of the first wire 71. Each of the first to fourth wires 71, 73, 81, and 83 may forms a perpendicular line, for example, 90° to a tangential line passing one point of the outline of the heat radiation plate 17.

As shown in FIG. 5, when an angle θ2 between the straight line X1 horizontal to the first lateral side S1 and the straight line Y1 horizontal to the second lateral side S2 is a right angle, an angle θ3 between the first straight line X2 passing both ends of the first wire 71 and the straight line X1 may be less than 90°, for example, an angle in the range of 10° to 80°. In this case, the straight line X1 extends along the first lateral side S1 of the first light emitting chip 31, and the straight line Y1 extends along the second lateral side S2 adjacent to the first lateral side S1 of the first light emitting chip 31. The first straight line X2 passing both ends of the first wire 71 and the angle θ3 may be varied depending on the location of the first light emitting chip 31. The second lateral side S2 may have a length longer than or equal to that of the first lateral side S1.

The first straight line X2 passing both ends of the first wire 71 may be offset at 5° or more from a straight line passing the center of the first and second light emitting chips 31 and 32. The first straight line X2 passing both ends of the first wire 71 may be offset at 5° or more from a straight line Y1 passing the second lateral side S2 of the first and second light emitting chips 31 and 32.

The first to fourth wires 71, 73, 81, and 83 according to the embodiment extend from the first, second, fourth, and fifth light emitting chips 31, 32, 41, and 42 disposed on the heat radiation plate 17 in the radial direction about the center of the heat radiation plate 17. Accordingly, the first to fourth wires 71, 73, 81, and 83 may have improved force against the tensile force in the molding member 25.

Figure 6:
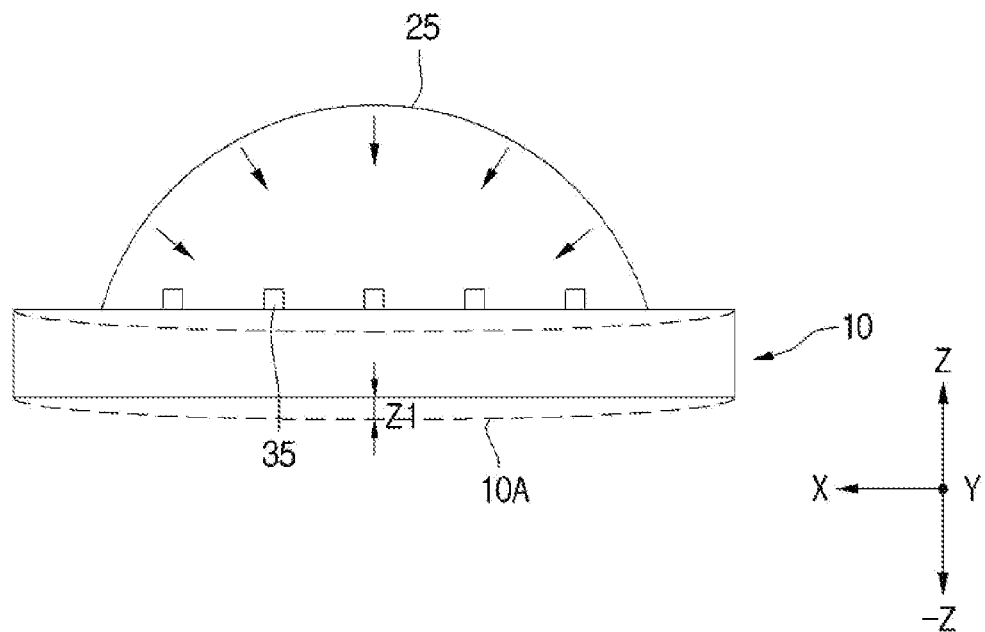
FIG. 6 is a sectional view showing a compressive deformation example of the circuit board of the light emitting device of FIG. 1.
Figure 7:
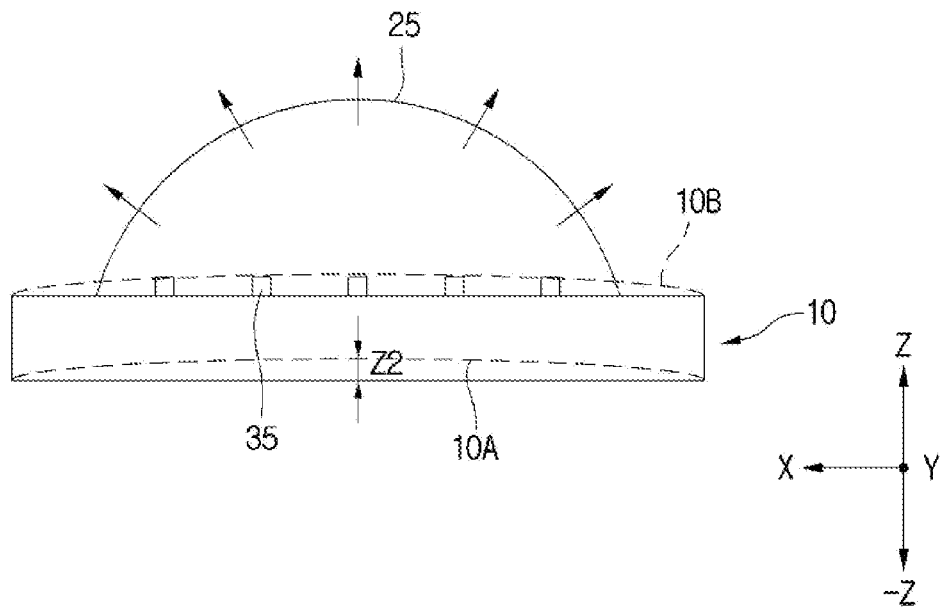
FIG. 7 is a sectional view showing a tensile deformation example of the circuit board of the light emitting device of FIG. 1.

Meanwhile, as shown in FIG. 6, as the light emitting chips 31, 32, and 33 operate, heat is emitted, and the emitted heat is conducted through the molding member 25. In this case, the circuit board 19 may be bent downward due to the thermal expansion of the molding member 25 as shown in a dotted line 10A. In addition, as shown in FIG. 7, if the light emitting chips 31, 32, and 33 become in an off state, when the molding member 25 is contracted, the circuit board 10 is recovered upward as shown in the dotted line 10B. In this case, as the first to fourth wires 71, 73, 81, and 83 are arranged in the same direction of the expansion direction or the contraction direction of the molding member 25, the external impact can be minimized. In this case, the circuit board 10 is bent with the variation Z1 of 50 μm or more in a negative direction when the molding member 25 is expanded, and bent with the variation Z2 of 70 μm in a Z axis direction when the molding member 25 is contracted. The variations in the expansion and the contraction of the molding member 25 may be varied depending on the material of the body 11, but the embodiment is not limited thereto.

If a connection is formed similarly to the wire 71a according to the comparative example as shown in FIG. 4, the connection direction is offset from the extracting or contraction direction of the molding member 25, so that the bonding portion of the wire 71a may become off from the light emitting chips. If the bonding are of the wire is off from the light emitting chips, the light emitting chip are not driven, but the reliability of the light emitting device may be degraded.

Figure 8:
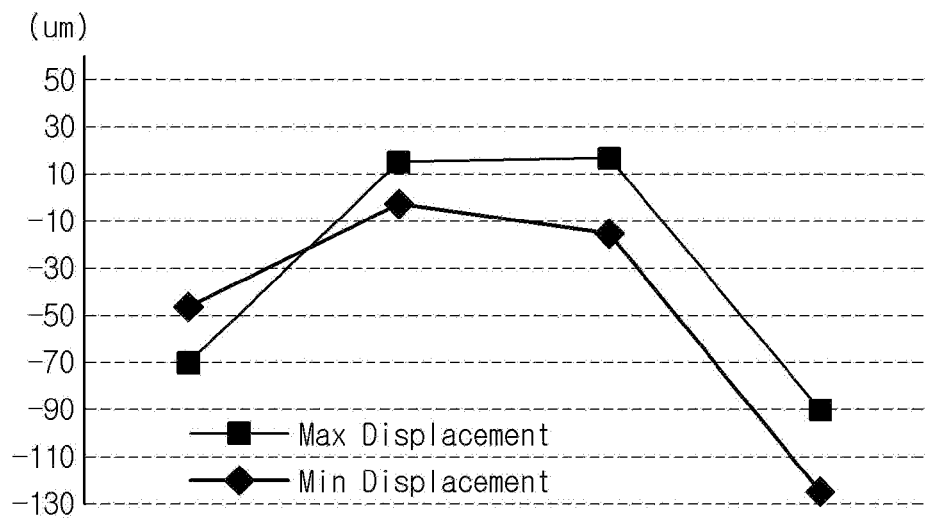
FIG. 8 is a graph showing a displacement caused by a vertical strain resulting from the compressive and tensile deformation of the circuit board of FIGS. 6 and 7.
Figure 9:
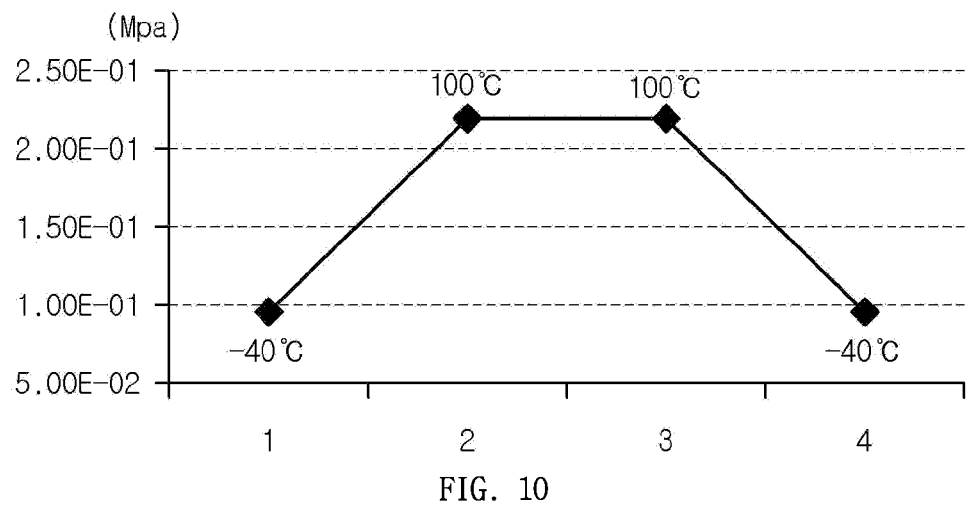
FIG. 9 is a graph showing equivalence stress according to the temperatures at the boundary region between the molding member and the reflective member of the circuit board according to the embodiment.
Figure 10:
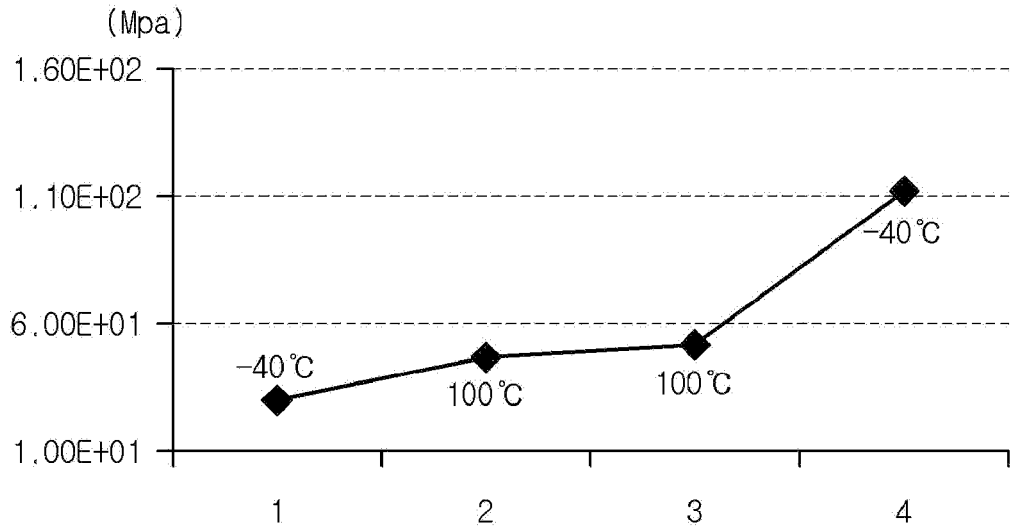
FIG. 10 is a graph showing the maximum (Max) deformation according to the temperatures at the boundary region between the reflective member and the molding member on the circuit board according to the embodiment.

FIG. 8 is a graph showing the distances of the maximum (max) displacement and the minimum (min) displacement in a vertical direction (Z) in a circuit board 10 shown in FIGS. 6 and 7. FIG. 9 is a graph showing the comparison of equivalent stress (Vonmises stress) as a function of a temperature at the boundary region between the reflective member and the molding member on the circuit board according to the embodiment. FIG. 10 is a graph showing the maximum (Max) deformation according to the temperatures at the boundary region between the reflective member and the molding member on the circuit board according to the embodiment. The equivalent stress represents Vonmises stress, which represents the intensity of torsional energy resulting from stress components at one point of the boundary region. Although the circuit board is deformed due to the molding member, the wires 71, 73, 81, and 83 passing the outer spherical surface of the molding member can be prevented from being disconnected. The temperature in the range of 40° C. or 100° C. is used for the illustrative purpose.

The first to fourth wires 71, 73, 81, and 83 according to the embodiment may extend to the radial direction about the center of the molding member 25. In the first to fourth wires 71, 73, 81, and 83, the tensile force transferred from the molding member 25 to the first to fourth wires 71, 73, 81, and 83 may be reduced, and the bonding portions of the first to fourth wires 71, 73, 81, and 83 may be prevented from being off from the molding member 25 due to external impact. The first to fourth wires 71, 73, 81, and 83 may be protected from the molding member 25.

As shown in the following table 1, a comparative example is a case that the wire is bonded similarly to the dotted wire of FIG. 4, and the embodiment is a case that the first wire (that is, the first wire or the second wire) is bonded in a perpendicular direction with respect to the tangential line passing one point of the outline of the heat radiation plate. The height of the highest point in the embodiment is in the range of 180 μm to 220 μm, and the height of the highest point in the comparative example is in the range of 150 μm to 170 μm.

TABLE 1

| Cycle | 0 | 100 | 200 | 300 | 400 | 500 |
|---|---|---|---|---|---|---|
| Comparative example (Failure/Number) | 0/23 | 1/23 | 1/23 | 3/23 | 6/23 | 10/23 |
| Embodiment (Failure/Number) | 0/22 | 0/22 | 0/22 | 0/22 | 0/22 | 0/22 |

Regarding a cycle, one cycle refers to one repetition at a predetermined temperature (−40° C. to 100° C.) among reliability items. The failures in the comparative example and the embodiment are checked with respect to 100, 200, 300, 400, and 500 cycles.

According to the comparative example, as shown in the experimental result, as a cycle is increased from 100 cycles to 500 cycles, the failure of the wire is gradually increased. For example, in the case of 400 cycles, six wires among 23 wires are failed, and 10 among 500 wires are failed.

However, according to the embodiment, wires are not failed regardless of the cycles. Accordingly, the wire bonding manner according to the embodiment can prevent the wires from being failed as compared to the wire bonding manner according to the comparative example. In addition, the wires connected between the bonding regions of the first and second metal layers and the light emitting chips sufficiently endure the external impact.

Figure 11:
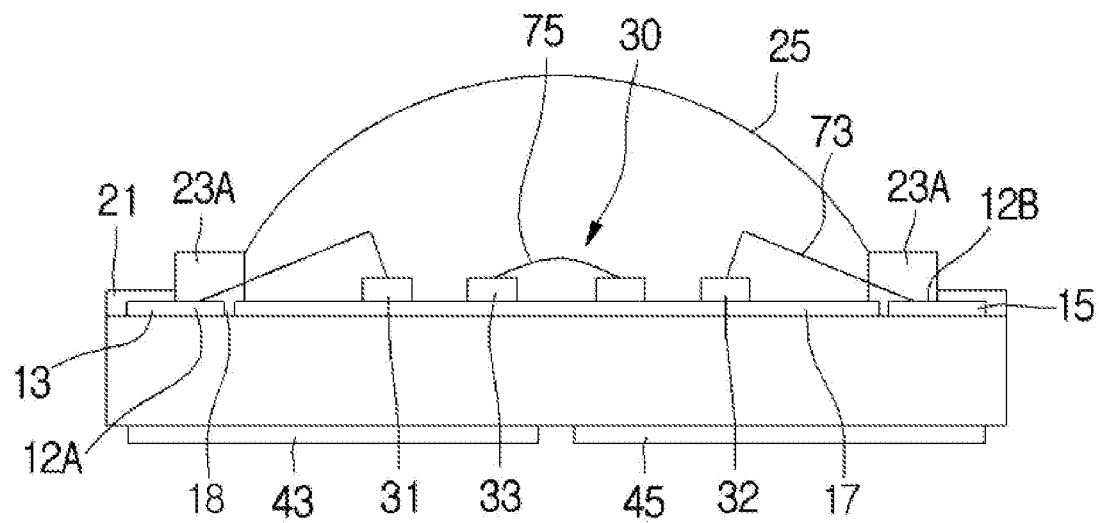
FIG. 11 is a sectional view showing another example of the light emitting device of FIG. 3.

FIG. 11 is another example of the light emitting device of FIG. 3. Referring to FIG. 11, a reflective member 23A may make contact with the heat radiation plate 17. Accordingly, the reflective member 23A is filled in the first gap part 18 while extending to the top surface of the heat radiation plate 17. Accordingly, the adhesive strength between the reflective member 23A and the heat radiation plate 17 can be enhanced. An inner surface of the reflective member 23A, for example, a contact surface with the molding member 25 may be a curved surface or an inclined surface.

Figure 12:
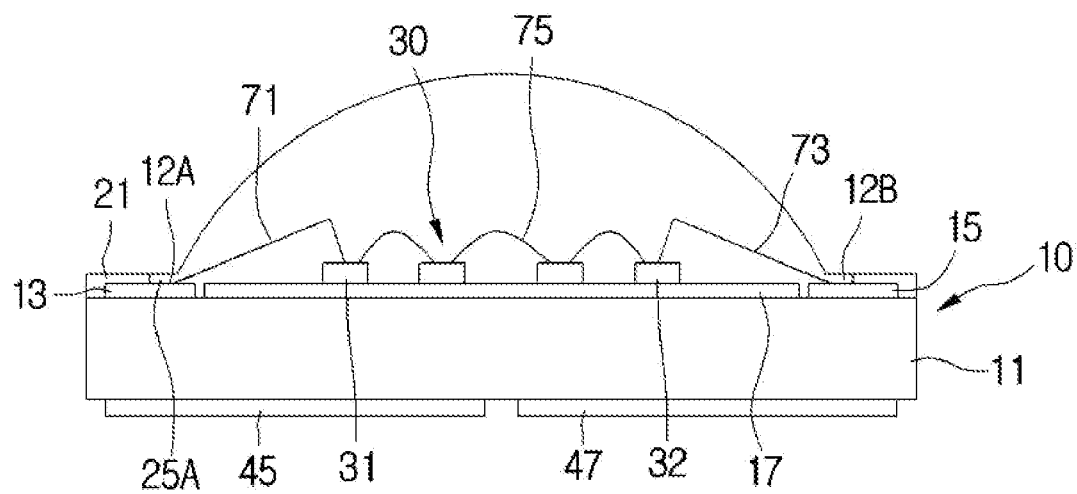
FIG. 12 is a sectional view showing still another example of the light emitting device of FIG. 3.

FIG. 12 is another example of the light emitting device of FIG. 3. Referring to FIG. 12, the molding member includes an extension part 25A extending from an outer peripheral portion of the molding member onto the first and second bonding regions 12A and 12B. Accordingly, the reflective member is not additionally formed, but the second ends of the first and second wires 71 and 73 are covered with the extension part 25A of the molding member 25. In this case, the wires may be covered with the same material.

Figure 13:
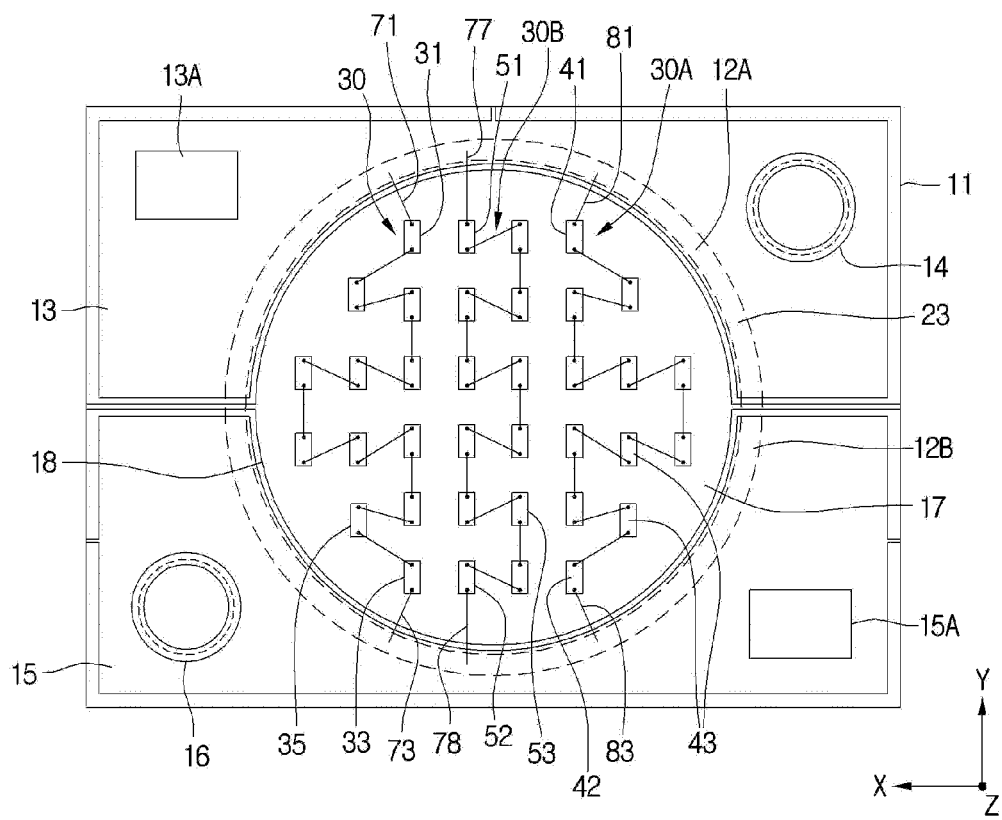
FIG. 13 is a view showing another example of the light emitting device of FIG. 1.

FIG. 13 is another example of FIG. 1. A plurality of light emitting parts 30, 30A, and 30B, for example, at least three light emitting parts include the first to third light emitting parts 30, 30A, and 30B. The first and second light emitting parts 30 and 30A may be understood by making reference to the description of FIG. 1. The third light emitting part 30B is disposed at the center region of the heat radiation plate 17, for example, disposed between the first and second light emitting parts 30 and 30A.

The third light emitting part 30B includes a seventh light emitting chip 51 adjacent to the first metal layer 13, an eighth light emitting chip 52 adjacent to the second metal layer 15, a plurality of ninth light emitting chips 53 connected between the seventh and eighth light emitting chips 51 and 52, a fifth wire 77 connected between the seventh light emitting chip 51 and the first metal layer 13, and a sixth wire 78 connected between the eighth light emitting chip 52 and the second metal layer 15. The third light emitting part 30B may include a connection member to connect the ninth light emitting chips 53 with each other, and the connection member includes a wire.

Both ends of the fifth wire 77 are connected with the seventh light emitting chip 51 and the first metal layer 13. Both ends of the sixth wire 78 are connected with the eighth light emitting chip 52 and the second metal layer 15. The fifth wire 77 is bonded to the first bonding region 12A of the first metal layer 13, and the sixth wire 78 is bonded to the second bonding region 12B of the second metal layer 15.

A plurality of ninth light emitting chips 53, for example, at least three light emitting chips may be connected with each other in series. The ninth light emitting chips 53 may be arranged in one row, two rows, or three or more rows. In addition, the ninth light emitting chips 53 may be connected with each other through the connection member. The seventh and eighth light emitting chips 51 and 52 are disposed at an input side and an output side of the third light emitting part 30B.

Each of the first to sixth wires 71, 73, 81, 83, 77, and 78 makes contact with the molding member 25 and the reflective member 23. Each of the first to sixth wires 71, 73, 81, 83, 77, and 78 is connected with inner parts of the molding member 25 and the reflective member. Each of the first to sixth wires 71, 73, 81, 83, 77, and 78 may protrude through the outer spherical surface of the molding member 25 and extend into the reflective member 23.

Meanwhile, the fifth wire 77 may extend from the seventh light emitting chip 51 in the radial direction about the center of the heat radiation plate 17. The eighth wire 78 may extend from the eighth light emitting chip 52 in the radial direction about the center of the heat radiation plate 17. The first to sixth wires 71, 73, 81, 83, 77, and 78 may extend to the radial direction about the center of the heat radiation plate 17. The first to sixth wires 71, 73, 81, 83, 77, and 78 may extend to the radial direction about the center of the molding member 25.

The straight line passing both ends of the fifth wire 77 may extend to the radial direction about the center of the heat radiation plate 17 or the molding member 25. The straight line passing both ends of the eighth wire 78 may extend to the radial direction about the center of the heat radiation plate 17 or the molding member 25.

An angle formed between the straight line to link both ends of the first wire 71 or the third wire 81 to each other and a straight line to link both ends of the fifth wire 77 to each other may be an acute angle, for example, 45° or less. An angle formed between the straight line to link both ends of the first wire 71 or the third wire 81 to each other and a straight line to link both ends of the sixth wire 77 to each other may be an acute angle, for example, 45° or less. As shown in FIG. 2, an angle R1 formed between the first straight line to link both ends of the first wire 71 and the second straight line to link both ends of the second wire 73 to each other may be an obtuse angle. An angle formed between the third straight line to link both ends of the third wire 81 and a fourth straight line to link both ends of the fourth wire 83 to each other may be an obtuse angle. An angle R2 between the first straight line and the third straight line may be an acute angle. The angle between the second straight line and the fourth straight line may be an acute angle.

Each of the fifth and sixth wires 77 and 78 may extend at an angle of 85° to 95°, for example, in a perpendicular direction with respect to a tangential line passing one point of the outline of the heat radiation plate 17.

Figure 14:
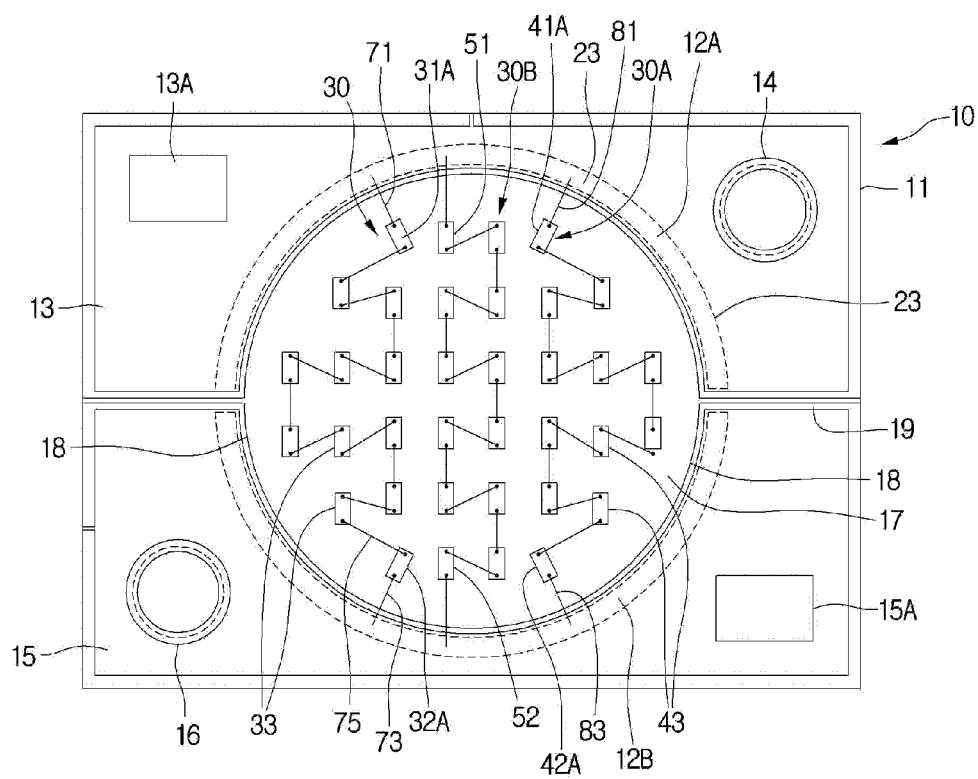
FIG. 14 is a plan view showing the light emitting device according to the second embodiment.
Figure 15:
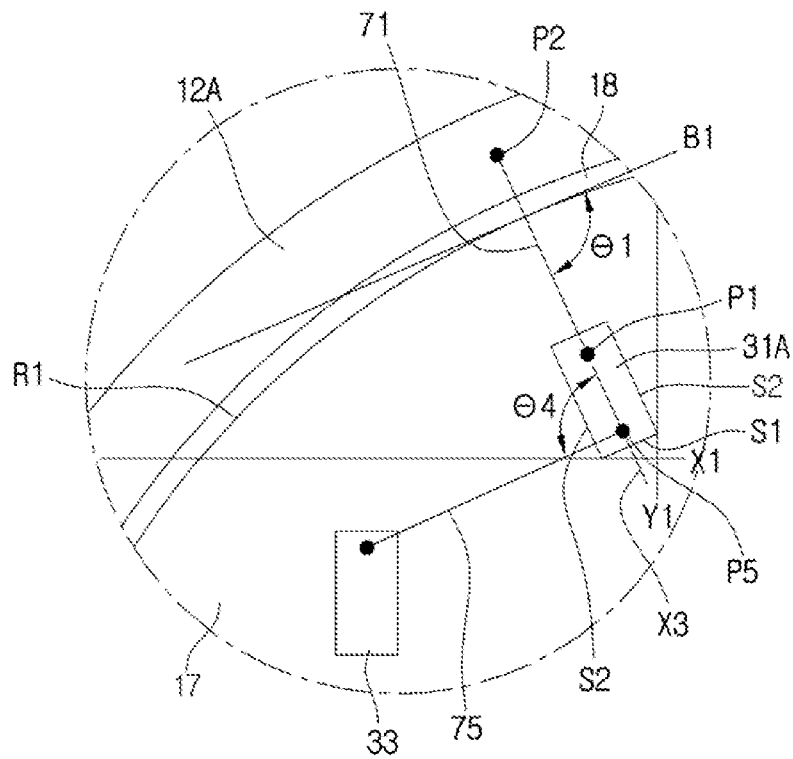
FIG. 15 is a partial enlarged view showing the light emitting device of FIG. 14.

FIG. 14 is a plan view showing a light emitting chip according to the second embodiment, and FIG. 15 is a partial enlarged view showing the light emitting chip of FIG. 14. In the following description of the second embodiment, the description of the elements the same as those of the first embodiment may be understood by making reference to the description of the first embodiment.

Referring to FIGS. 14 and 15, the light emitting chip includes a body 11, first and second metal layers 13 and 15 on a top surface of the body 11, a heat radiation plate 17 between the first and second metal layers 13 and 15 on the top surface of the body 11, a plurality of light emitting parts 30, 30A, and 30B on the heat radiation plate 17, a reflective member 23 disposed on the circumference of the heat radiation plate 17, a molding member 25 on the heat radiation plate 17, and wires 71, 73, 81, and 83 connected with the first and second metal layers 13 and 15 and disposed in the radial direction about the center of the heat radiation plate 17.

According to the embodiment, a plurality of light emitting parts 30, 30A, and 30B include at least three light emitting parts. For example, the light emitting parts include the first light emitting part 30 disposed at the first region of the heat radiation plate 17, the second light emitting part 30A disposed in the second region of the heat radiation plate 17, and the third light emitting part 30B disposed between the first and second light emitting parts 30 and 30A.

Since the third light emitting part 30B has the same configuration as that shown in FIG. 13, the details of the third light emitting part 30B may be understood by making reference to the description of FIG. 13. Accordingly, the following description will be made while focusing on the first and second light emitting parts 30 and 30A.

The first light emitting part 30 includes a first light emitting chip 31A, a second light emitting chip 32A, a plurality of third light emitting chips 33, a first wire 71, a second wire 73, and a connection member 75. The second light emitting part 30A includes a fourth light emitting chip 41A, a fifth light emitting chip 42A, a plurality of sixth light emitting chips 43, a third wire 81, a fourth wire 83, and a connection member 85.

Two lateral sides among lateral sides of the first light emitting chip 31A are arranged in parallel to the first straight line passing both ends of the first wire 71. The two lateral sides of the first light emitting chip 31A may be disposed in the same direction as the extension direction of the first straight line. Two lateral sides among the lateral sides of the second light emitting chip 32A are arranged in parallel to the second straight line passing both ends of the second wire 73. The two lateral sides of the second light emitting chip 32A are arranged in the same direction as the extension direction of the second straight line of the second wire 73. At least one lateral side of the first and second light emitting chips 31A and 32A is tilted from the arrangement direction of the third light emitting chip 33, or the straight line passing the center of the first and second light emitting chips 31A and 32A. The third straight line and the fourth straight line to link both ends of the third and fourth wires 81 and 83 to each other extend in the same direction as the extension direction of at least one lateral side of each of the fourth and fifth light emitting chips 41A and 42A.

As shown in FIG. 15, in the first light emitting chip 31A, the straight line X horizontal to the first lateral side S1 forms a right angle together with the straight line Y1 horizontal to the second lateral side S2. The plane direction of the second lateral side S2 of the first light emitting chip 31A is the same as the extension direction of the first straight line X3 passing both ends of the first wire 71. For example, an angle θ4 between the first straight line X3 extending from the first wire 71 and the straight line X1 may be formed in the range of 30° to 70°. The first straight line X3 passes the first end P5 of the third wire 75 connected with the first light emitting chip 31A.

The first straight line X3 passing both ends of the first wire 71, which is disposed in parallel to the straight line parallel to the second lateral side S2 of the first light emitting chip 31A, may form an angle, for example, in the range of 85° to 95° approximating a perpendicular line to the tangential line B1. The first straight line X3 passing both ends of the first wire 71 may be disposed as a perpendicular line to the tangential line B1. If the first straight line X3 passing both ends of the first wire 71 is disposed in a direction of the perpendicular line to the tangential line B1, external impact may be minimized.

At least one of the first, second, fourth, and fifth light emitting chips 31A, 32A, 41A, and 42A may be tilted from the direction that the third and sixth light emitting chips 33 and 43 are arranged.

Figure 16:
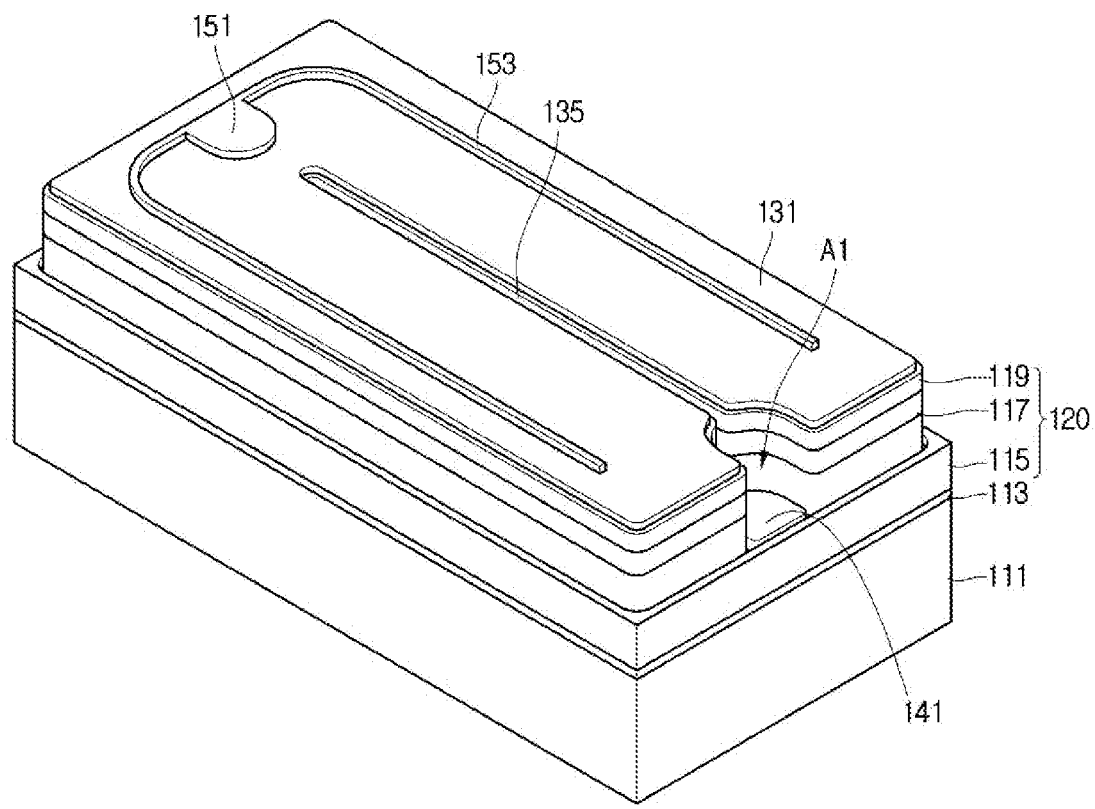
FIG. 16 is a view showing a light emitting chip of the light emitting device according to the embodiment.

FIG. 16 is a view showing one example of a light emitting chip of a light emitting device according to the embodiment.

Referring to FIG. 16, the light emitting device includes a substrate 111, a buffer layer 113, a first conductive semiconductor layer 115, an active layer 117, a second conductive semiconductor layer 119, an electrode layer 131, a first electrode pad 141, and a second electrode pad 151.

The substrate 111 may include a transmissive substrate, an insulating substrate or a conductive substrate. For example, the substrate 111 may include at least one of sapphire ($Al_2O_3$), SiC, Si, GaAs, GaN, ZnO, Si, GaP, InP, Ge, Ga2O3, and $LiGaO_3$. A plurality of protrusions may be formed on the top surface of the substrate 111. The protrusions may be formed by etching the substrate 111 or may be formed in a light extraction structure, such as an additional roughness. The protrusions may have a stripe shape, a hemispherical shape, or a dome shape. The thickness of the substrate 111 may be formed in the range of 30 μm to 300 μm, but the embodiment is not limited thereto.

The buffer layer 113 may be formed on the substrate 111. The buffer layer 112 may be formed in at least one layer using the group II to VI compound semiconductors. The buffer layer 113 includes a semiconductor layer using the group III-V compound semiconductor. For example, the buffer layer 113 includes at least one of compound semiconductors, such as GaN, InN, AlN, InGaN, AlGaN, InAlGaN, and AlInN, as a semiconductor having the compositional formula of $In_xAl_yGa1-x-yN$ ($0 \leq x \leq 1$, $0 \leq y \leq 1$, and $0 \leq x+y \leq 1$). The buffer layer 113 may be formed in a super lattice structure by alternately arranging mutually different semiconductor layers.

The buffer layer 113 may be formed to reduce the difference in a lattice constant between the substrate 111 and a nitride-based semiconductor layer, and may serve as a defect control layer. The buffer layer 113 may have an intermediate value between the lattice constant of the substrate 111 and the lattice constant of the nitride-based semiconductor layer. The buffer layer 113 may be formed of an oxide such as a ZnO layer, but the embodiment is not limited thereto. The buffer layer 113 may have a lattice constant between 30 nm to 500 nm, but the embodiment is not limited thereto.

A low conductive layer is formed on the buffer layer 113. The low conductive layer serves as an undoped semiconductor layer, and has electrical conductivity lower than that of the first conductive semiconductor layer. The conductive layer may be realized as a GaN-based semiconductor using a group III-V compound semiconductor. Although the undoped semiconductor layer is not intentionally doped with conductive dopants, the undoped semiconductor layer has a first conductive characteristic. The undoped semiconductor layer may not be formed, but the embodiment is not limited thereto.

The first conductive semiconductor layer 115 may be formed on the buffer layer 113. The first conductive semiconductor layer 115 may be realized using a group III-V compound semiconductor doped with a first conductive dopant. For example, the first conductive semiconductor layer 115 may be realized using a semiconductor material having a compositional formula of $In_xAl_yGa1-x-yN$ ($0 \leq x \leq 1$, $0 \leq y \leq 1$, $0 \leq x+y \leq 1$). If the first conductive semiconductor layer 115 is an N type semiconductor, the first conductive dopant includes Si, Ge, Sn, Se, or Te as an N type dopant.

A semiconductor layer may be formed between the buffer layer 113 and the first conductive semiconductor layer 115, and the semiconductor layer may be formed in a super lattice structure in which a first layer and a second layer different from each other are alternately arranged. The first and second layer may have the thickness of several Å.

The first conductive clad layer (not shown) may be formed between the first conductive semiconductor layer 115 and the active layer 117. The first conductive clad layer may include a GaN based semiconductor, and the band gap of the first conductive clad layer may be greater than that of a barrier layer of the active layer 117. The first conductive clad layer confines carriers.

The active layer 117 is formed on the first conductive semiconductor layer 115. The active layer 117 may be formed in at least one of a single quantum well structure, a multi-quantum well structure, a quantum wire structure, and a quantum dot structure. The active layer 117 is formed by alternately providing a well layer/barrier layer. For example, for the cycle of the well layer/barrier layer, 2 to 30 cycles of the lamination structure of InGaN/GaN, AlGaN/GaN, InGaN/AlGaN, InGaN/InGaN may be formed.

A second conductive clad layer is formed on the active layer 117, and has a bandgap higher than that of a barrier layer of the active layer 117. The second conductive clad layer may include a GaN-based semiconductor.

A second conductive semiconductor layer 119 is formed on the second conductive clad layer, and includes second conductive-type dopants. The second conductive semiconductor layer 119 may include one compound semiconductors, such as GaN, InN, AlN, InGaN, AlGaN, InAlGaN, and AlInN. When the second conductive semiconductor layer 119 is a P type semiconductor, the second conductive dopant is a P type dopant, such as Mg, Zn, Ca, Sr, or Ba.

In a light emitting structure 120, the first conductive type and the second conductive type may be opposite to the structure. For example, the second conductive semiconductor layer 119 may be realized as an N type semiconductor layer, and the first conductive layer 115 may be realized at a P type semiconductor layer. An N type semiconductor layer, which is a third conductive semiconductor layer having a polarity opposite to that of the second conductive type, may be further formed on the second conductive semiconductor layer 119. In the light emitting device, the first conductive semiconductor layer 115, the active layer 117, and the second conductive semiconductor layer 119 may be defined as the light emitting structure 120. The light emitting structure 120 may be realized in one of an N-P junction structure, a P-N junction structure, an N-P-N junction structure, and a P-N-P junction structure. In the N-P and P-N junction structure, an active layer is disposed between two layers. In the N-P-N junction structure, or the P-N-P junction structure, at least one active layer is included among three layers.

A first electrode pad 141 is formed on the first conductive semiconductor layer 115, and an electrode layer 131 and a second electrode pad 151 are formed on the second conductive semiconductor layer 119.

The electrode layer 131 serves as a current spreading layer, and may be formed of a material having a transmissivity and an electrical conductivity. The electrode layer 131 may have a refractive index lower than that of the compound semiconductor layer.

The electrode layer 131 is formed on a top surface of the second conductive semiconductor layer 119, and selectively includes ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx, and NiO. The electrode layer 131 may be formed in at least one layer. According to another example, the electrode layer 131 may include a reflective electrode layer, and may selectively include a metal material, such as Al, Ag, Pd, Rh, Pt, or Ir, The first electrode pad 141 and the second electrode pad 151 may selectively include Ti, Ru, Rh, Ir, Mg, Zn, Al, In, Ta, Pd, Co, Ni, Si, Ge, Ag and Au.

An insulating layer may be further formed on the surface of the light emitting device. The insulating layer can prevent the inter-layer short of the light emitting structure 120, and prevent moisture from being infiltrated.

The second electrode pad 151 may be formed on the second conductive semiconductor layer 119 and/or the electrode layer 131, and may include the second electrode pattern 153. The second electrode pattern 153 may be formed in an arm structure or a finger structure in which the second electrode pattern 153 is separated from the second electrode pad 151. The second ohmic pad 151 includes metal layers including the characteristics of an ohmic contact layer, an adhesive layer, and a bonding layer. The second ohmic pad 151 may have a non-transmissive property, but the embodiment is not limited thereto.

When viewed on the light emitting chip, the second electrode pad 151 is spaced apart from the first electrode pad 141 by ½ of any one-side width of the light emitting chip, and the second electrode pattern 153 may be formed with the length corresponding to ½ or more of one-side width of the light emitting chip.

At least one of the second electrode pad 151 and the second electrode pattern 153 may make ohmic contact with the top surface of the second conductive semiconductor layer 119, but the embodiment is not limited thereto.

The first electrode pad 141 is formed in the first region A1 of the top surface of the first conductive semiconductor layer, and the first region A1 is a portion of the first conductive semiconductor layer 115. Portions of the second conductive semiconductor layer 119 and the active layer 117 are etched, and a portion of the top surface of the first conductive semiconductor layer 115 is exposed. In this case, the top surface of the first conductive semiconductor layer 115 is stepped from the lateral side of the active layer 117, and located lower than the bottom surface of the active layer 117.

A groove 125 is formed in the light emitting structure 120, and formed at the depth from the top surface of the light emitting structure 120 to expose the first conductive semiconductor layer 115. The depths of the first region A1 of the first conductive semiconductor layer 115 and the groove 125 may be equal to or different from the depth from the top surface of the light emitting structure 120. The first electrode pad 141 may be connected with the first electrode pattern.

A wire according to the embodiment is bonded to the first and second electrode pads 141 and 151.

<Lighting System>

The light emitting device according to the embodiment may be applied to a lighting system. The lighting system has a structure in which a plurality of light emitting devices are arrayed. The lighting system may include a display device shown in FIGS. 17 and 18, a lighting device shown in FIG. 19, a lighting lamp, a signal lamp, a headlight of a vehicle, or an electric signboard.

Figure 17:
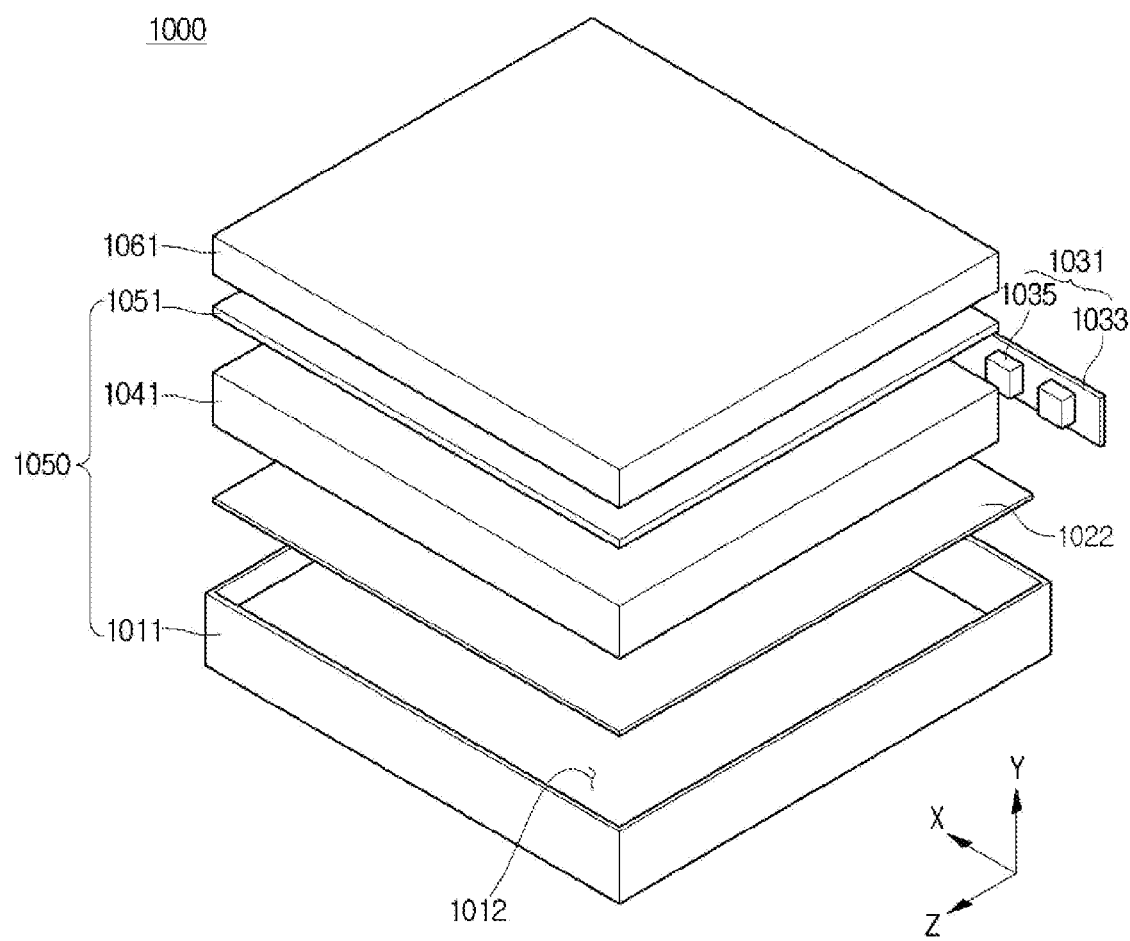
FIG. 17 is a view showing a display device having the light emitting device according to the embodiment.

FIG. 17 is an exploded perspective view showing a display device having the light emitting device according to the embodiment.

Referring to FIG. 17, a display device 1000 according to the embodiment may include a light guide plate 1041, a light emitting module 1031 to supply the light to the light guide plate 1041, a reflective member 1022 disposed below the light guide plate 1041, an optical sheet 1051 disposed above the light guide plate 1041, a display panel 1061 disposed above the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed at one side of the light guide plate 1041 to supply the light to at least one side of the light guide plate 1041. The light emitting module 1031 serves as the light source of the display device. At least one light emitting module 1031 is disposed to directly or indirectly supply the light from one side of the light guide plate 1041. The light emitting module 1031 may include a substrate 1033 and light emitting devices 1035 according to the embodiments. The light emitting devices 1035 are arrayed on the substrate 1033 while being spaced apart from each other by the predetermined interval.

The substrate 1033 may include a printed circuit board (PCB) including a circuit pattern (not shown). In addition, the substrate 1033 may include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the substrate 1033 may be omitted. The heat dissipation plate partially makes contact with the top surface of the bottom cover 1011.

In addition, the light emitting devices 1035 are arranged on the substrate 1033 such that a light exit surface of the light emitting devices 1035 is spaced apart from the light guide plate 1041 by a predetermined interval, but the embodiment is not limited thereto. The light emitting devices 1035 may directly or indirectly supply the light to a light incident surface, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of a light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving part 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metal material or resin material. In addition, the bottom cover 1011 may include metal or non-metal material having superior thermal conductivity, but the embodiment is not limited thereto.

The display panel 1061, for example, is an LCD panel including first and second transparent substrates, which are opposite to each other and include a transparent material, and a liquid crystal layer disposed between the first and second substrates. A polarizing plate can be attached to at least one surface of the display panel 1061, but the embodiment is not limited thereto. The display panel 1061 displays information by a light passing through an optical sheet 1051. The display apparatus 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel, and the brightness enhanced sheet improves the brightness by reusing the lost light. In addition, a protective sheet may be disposed on the display panel 1061, but the embodiment is not limited thereto.

The light guide plate 1041 and the optical sheet 1051 can be disposed on the light path of the light emitting module 1031 as optical members, but the embodiment is not limited thereto.

Figure 18:
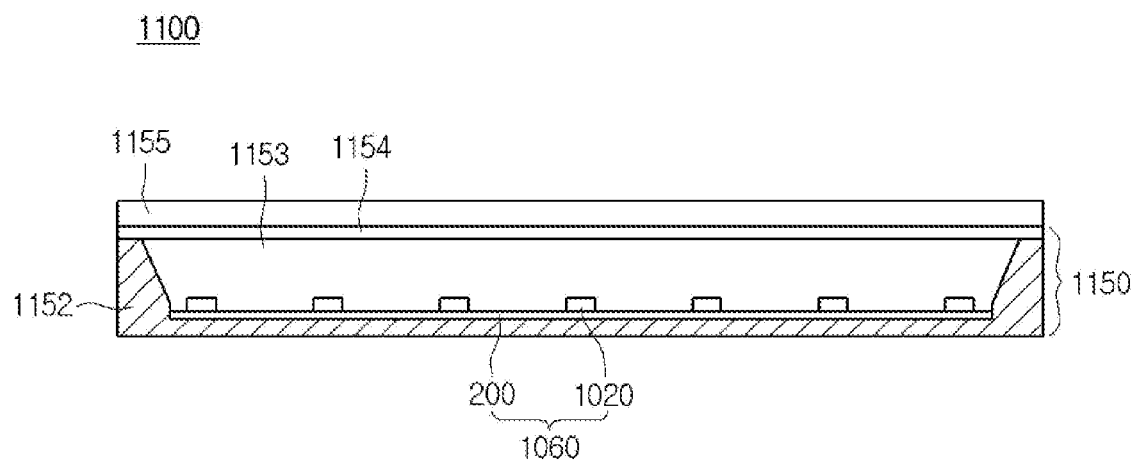
FIG. 18 is a sectional view showing another example of the display device having the light emitting device according to the embodiment.

FIG. 18 is a view showing the display device having the light emitting device according to the embodiment.

Referring to FIG. 18, the display apparatus 1100 includes a bottom cover 1152, a substrate 1120 on which the light emitting devices 1124 are arrayed, an optical member 1154, and a display panel 1155.

The substrate 1120 and the light emitting device 1124 may constitute the light emitting module 1160. In addition, the bottom cover 1152, at least one light emitting module 1160, and the optical member 1154 may constitute the light unit 1150. The bottom cover 11152 may include a receiving part 1153, but the embodiment is not limited thereto. The light emitting module 1160 includes the substrate 1120 and a plurality of light emitting devices 1124 arranged on the substrate 1120.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate may be omitted. The diffusion sheet diffuses the incident light, the horizontal and vertical prism sheet concentrates the incident light onto the display panel, and the brightness enhanced sheet improves the brightness by reusing the lost light.

The optical member 1154 is disposed on the light source module 1160. The optical member 1154 provides the light emitted from the light source module 1150 as a surface light source, or diffuses or concentrates the light.

Figure 19:
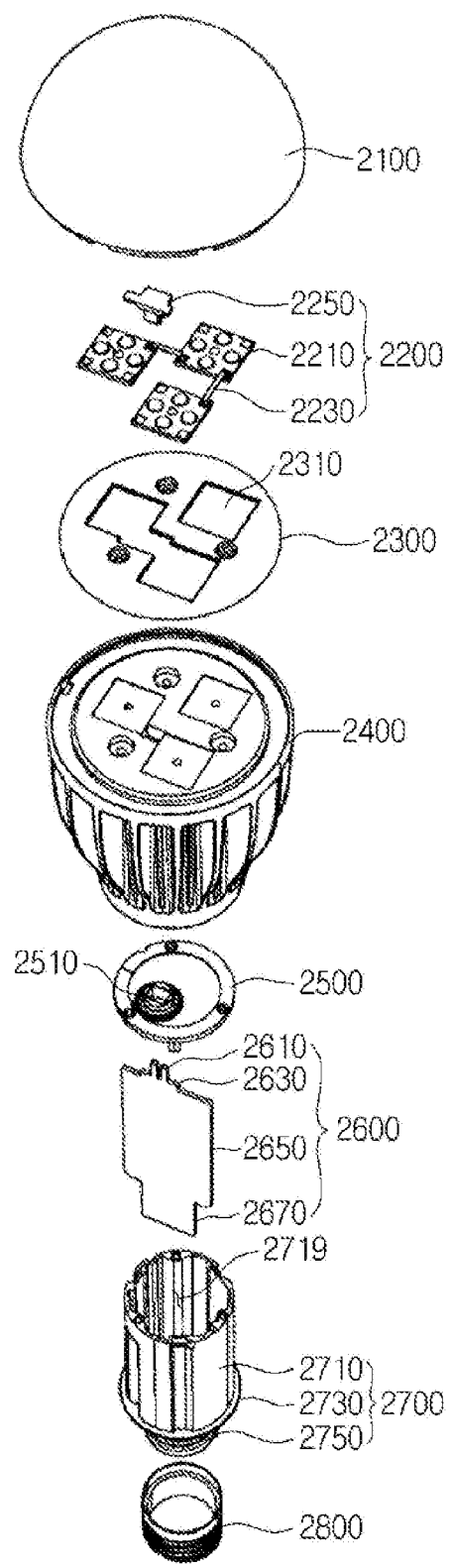
FIG. 19 is a perspective view showing a lighting device having the light emitting device according to the embodiment.

FIG. 19 is an exploded perspective view showing a lighting device having the light emitting device according to the embodiment.

Referring to FIG. 19, the lighting system according to the embodiment may include a cover 2100, a light source module 2200, a radiator 2400, a power supply part 2600, an inner case 2700, and a socket 2800. The lighting device according to the embodiment may further include at least one of a member 2300 and a holder 2500. The light source module 2200 may include the light emitting device according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light disposed from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. If the milk-white paint is used, the light from the light source module 2200 may be scattered and diffused to discharge light output.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a milk-white paint. For example, the member 2300 again reflects light, which is reflected by the inner surface of the cover 2100 and is returned to the direction of the light source module 2200, to the direction of the cover 2100. Accordingly, the light efficiency of the lighting device according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives and radiates heats from the light source module 2200 and the power supply part 2600.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through which a protrusion of the power supply part 2600 passes.

The power supply part 2600 processes or converts an electric signal received from the outside and provides the processed or converted electric signal to the light source module 2200. The power supply part 2600 is received in a receiving groove 2719 of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power disposed from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. The extension part 2670 may be electrically connected with the socket 2800 through a wire.

The inner case 2700 may include a molding part therein together with the power supply part 2600. The molding part is prepared by hardening molding liquid, and the power supply part 2600 may be fixed inside the inner case 2700 by the molding part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment can improve the reliability of the light emitting device.

The light emitting device according to the embodiment may be applied a lighting device, such as a lighting lamp, indoor lamp, an outdoor lamp, an indicator, and a headlight lamp.

The invention claimed is:
1. A light emitting device comprising:
a body;
first and second metal layers on a top surface of the body;
a heat radiation plate disposed between the first and second metal layers and having a circular outline;
a plurality of light emitting parts on the heat radiation plate;
first and second bonding regions disposed on the first and second metal layers and electrically connected with the light emitting parts; and
a molding member disposed on the heat radiation plate to cover the light emitting parts,
wherein each of the light emitting parts includes a plurality of light emitting chips connected with each other, and a plurality of wires to electrically connect the light emitting chips with the first and second bonding regions, and
the wires of each light emitting part are disposed in a radial direction with respect to a center axis of the heat radiation plate,
wherein the light emitting parts include a first light emitting part disposed in a first region of the heat radiation plate, a first light emitting chip adjacent to the first metal layer;
a first wire connected between the first light emitting chip and the first bonding region of the first metal layer; and
a connection member between the first light emitting chip and a third light emitting chip adjacent to the first light emitting chip;

wherein the first wire is arranged in parallel to a first side of the first light emitting chip, and wherein the connection member is arranged in parallel to a second side of the first light emitting chip.

2. The light emitting device of claim 1, further comprising a reflective member at an outer circumference of the molding member, wherein the wires are connected with the first and second bonding regions of the first and second metal layers disposed under the reflective member.

3. The light emitting device of claim 1, wherein a straight lines that pass through both ends of the wires are not parallel to each other and the wires of each of the light emitting parts are connected to the light emitting chip different from each other.

4. The light emitting device of claim 1, wherein the light emitting parts include a first light emitting part disposed in a second light emitting part disposed in a second region of the heat radiation plate, wherein the first light emitting part comprises:

a second light emitting chip adjacent to the second metal layer;

a plurality of third light emitting chips connected between the first light emitting chip and the second light emitting chip;

a second wire connected between the second light emitting chip and the second bonding region of the second metal layer, and wherein a first straight line passing through both ends of the first wire is not parallel to a second straight line passing through both ends of the second wire.

5. The light emitting device of claim 4, wherein an angle between the first straight line passing through the ends of the first wire and the second straight line passing through the ends of the second wire is an obtuse angle.

6. The light emitting device of claim 4, wherein the first straight line to connect the ends of the first wire with each other extends in a direction adjacent to perpendicular line or a perpendicular direction with respect to a first tangential line passing through one point of the outline of the heat radiation plate, and the second straight line to connect the ends of the second wire with each other extends in a direction adjacent to perpendicular line or a perpendicular direction with respect to a second tangential line passing through one point of the outline of the heat radiation plate.

7. The light emitting device of claim 6, wherein the first straight line is arranged at an angle of 85° to 95° with respect to the first tangential line, and the second straight line is arranged at an angle of 85° to 95° with respect to the second tangential line.

8. The light emitting device of claim 7, wherein the first straight line is arranged at an angle of 90° with respect to the first tangential line, and the second straight line is arranged at an angle of 90° with respect to the second tangential line.

9. The light emitting device of claim 4, wherein the second light emitting part comprises:

a fourth light emitting chip adjacent to the first metal layer;

a fifth light emitting chip adjacent to the second metal layer;

a plurality of sixth light emitting chips connected between the fourth light emitting chip and the fifth light emitting chip;

a third wire connected with the fourth light emitting chip and the first bonding region of the first metal layer; and a fourth wire connected with the fifth light emitting chip and the second bonding region of the second metal layer, and wherein a third straight line passing through both ends of the third wire is not parallel to a fourth straight line passing through both ends of the fourth wire.

10. The light emitting device of claim 9, wherein an angle between the first straight line passing the ends of the first wire and the third straight line passing the ends of the third wire is an acute angle.

11. The light emitting device of claim 4, wherein at least one of the first and second straight lines is offset by an angle of 5° from a straight line passing through a center of the first light emitting chip and a center of the second light emitting chip.

12. The light emitting device of claim 4, further comprising a protective layer on the first and second metal layers, wherein the first and second bonding regions are disposed between the protective layer and the molding member, and the reflective member are contacted with the first and second bonding regions.

13. The light emitting device of claim 4, wherein the third light emitting chips comprise at least three light emitting chips connected with each other in series between the first and second light emitting chips, and at least one of the light emitting chips is arranged in parallel to a straight line passing through centers of the first and second light emitting chips.

14. The light emitting device of claim 13, wherein at least one of the wires has a highest point located higher than a highest point of the wire connected with the third light emitting chips.

15. The light emitting device of claim 4, wherein at least one of the first and second light emitting chips has a lateral side parallel to at least one of the first straight line and the second straight line and tilted with respect to a straight line passing through centers of the first and second light emitting chips.

16. The light emitting device of claim 1, wherein the light emitting chips are arranged in parallel to or in line with straight lines that connect both ends of the wires with each other in one of the light emitting parts.

17. A light emitting device comprising:

a body;

a heat radiation plate disposed on the body and having a circular shape;

first and second metallic layers disposed at a circumference of the heat radiation plate and having a first bonding area region a second bonding region spaced apart from the heat radiation plate;

a plurality of light emitting parts on the heat radiation plate; and a molding member on the heat radiation plate to cover the light emitting parts, wherein each of the light emitting parts includes a plurality of light emitting chips connected with each other, and a plurality of wires to electrically connect the light emitting chips with the first and second bonding areas, and wherein straight line that pass through both ends of the wires are disposed in a radial direction with respect to a central axis of the heat radiation plate, wherein the light emitting parts include a first light emitting part disposed in a first region of the heat radiation plate and a second light emitting part disposed in a second region of the heat radiation plate, wherein the first light emitting part comprises:

a first light emitting chip adjacent to the first metal layer;

a second light emitting chip adjacent to the second metal layer;

a plurality of third light emitting chips connected between the first light emitting chip and the second light emitting chip;

a first wire connected between the first light emitting chip and the first bonding region of the first metal layer; and a second wire connected between the second light emitting chip and the second bonding region of the second metal layer, wherein a first straight line passing through both ends of the first wire is not parallel to a second straight line passing through both ends of the second wire, wherein the third light emitting chips comprise at least three light emitting chips connected with each other in series between the first and second light emitting chips, and at least one of the light emitting chips is arranged in parallel to a straight line passing through centers of the first and second light emitting chips, and wherein at least one of the wires has a highest point located higher than a highest point of the wire connected with the third light emitting chips.

18. The light emitting device of claim 17, further comprising a reflective member at a circumference of the molding member, wherein the first and second bonding regions are disposed under the reflective member, the wires of each light emitting part comprises a first wire connected with the first bonding region and a second wire connected with the second bonding region, and the first and second wires are contacted with the molding member and the reflective member.

19. The light emitting device of claim 18, wherein an angle between a straight line that connects both ends of the first wire to each other and a straight line that connects both ends of the second wire to each other is an obtuse angle.

20. The light emitting device of claim 18, wherein each of the light emitting parts has at least three light emitting chips, and a lower circumference of the molding member has a shape of a circle having a diameter greater than a diameter of the heat radiation plate.

* * * * *